United States Patent
Takigawa et al.

(10) Patent No.: US 6,865,200 B2
(45) Date of Patent: Mar. 8, 2005

(54) COOLING DEVICE

(75) Inventors: Hiroshi Takigawa, Isehara (JP);
Tetsuro Sakano, Kawasaki (JP); Yuji Nishikawa, Yamana (JP); Masao Sato, Takatsuki (JP); Shinya Naito, Yamanashi (JP); Ryusuke Miyata, Yamanashi (JP); Koji Hayano, Yamanashi (JP)

(73) Assignee: Fanuc LTD, Yamanashi (JP)

(*) Notice: Subject to any disclaimer, the term of this patent is extended or adjusted under 35 U.S.C. 154(b) by 414 days.

(21) Appl. No.: 10/178,454

(22) Filed: Jun. 25, 2002

(65) Prior Publication Data

US 2002/0195238 A1 Dec. 26, 2002

(30) Foreign Application Priority Data

Jun. 25, 2001 (JP) ........................................ 2001-191707

(51) Int. Cl.⁷ ................................................ H01S 3/04
(52) U.S. Cl. .............................. 372/35; 372/34; 372/36
(58) Field of Search ..................................... 372/34–36

(56) References Cited

U.S. PATENT DOCUMENTS

| | | | | |
|---|---|---|---|---|
| 3,884,558 A | * | 5/1975 | Dunn et al. ................... | 359/845 |
| 5,105,430 A | * | 4/1992 | Mundinger et al. ............ | 372/35 |
| 5,241,450 A | * | 8/1993 | Bernhardt et al. ........... | 361/689 |
| 5,453,641 A | * | 9/1995 | Mundinger et al. .......... | 257/714 |
| 5,520,244 A | * | 5/1996 | Mundinger et al. ..... | 165/104.33 |
| 6,097,744 A | * | 8/2000 | Takigawa et al. ............. | 372/34 |
| 6,151,341 A | * | 11/2000 | Bull et al. ..................... | 372/35 |
| 6,245,589 B1 | * | 6/2001 | Takigawa et al. ............. | 438/26 |
| 6,266,881 B1 | * | 7/2001 | Takigawa et al. ...... | 29/890.039 |
| 6,330,259 B1 | * | 12/2001 | Dahm .......................... | 372/35 |
| 6,340,053 B1 | * | 1/2002 | Wu et al. .................... | 165/167 |
| 6,387,286 B1 | * | 5/2002 | Takigawa et al. ............. | 216/41 |
| 6,480,514 B1 | * | 11/2002 | Lorenzen et al. ............. | 372/35 |
| 6,495,278 B1 | * | 12/2002 | Schmid et al. ................ | 429/30 |
| 6,497,274 B2 | * | 12/2002 | Cheadle ....................... | 165/167 |
| 6,643,302 B1 | * | 11/2003 | Nishikawa et al. ........... | 372/35 |
| 6,647,035 B1 | * | 11/2003 | Freitas et al. ................. | 372/36 |
| 6,692,860 B2 | * | 2/2004 | Inoue et al. .................. | 429/35 |
| 6,699,613 B2 | * | 3/2004 | Inoue et al. .................. | 429/35 |
| 2001/0044042 A1 | * | 11/2001 | Inoue et al. .................. | 429/35 |

FOREIGN PATENT DOCUMENTS

| | | |
|---|---|---|
| JP | 10-209531 | 8/1998 |
| JP | 2001-44555 | 2/2001 |

* cited by examiner

Primary Examiner—Minsun Oh Harvey
Assistant Examiner—Phillip Nguyen
(74) Attorney, Agent, or Firm—Staas & Halsey LLP

(57) ABSTRACT

A cooling device suitable for cooling a laser diode bar constituting a surface illuminating device as a light source for exciting a laser medium of a solid-state laser oscillator of high power. The cooling device is capable of flowing coolant at sufficient flow rate by reducing the pressure loss in the flow passage of the coolant in the device, to realize a light source device of small thickness with high cooling capability and high reliability. The cooling device comprises a first plate member, one or more second plate member and a third plate member to be joined together to form a laminated body. The second plate member has grooved paths formed on both surfaces thereof and having depths greater than a half of thickness of the plate member, and also opened paths for communicating grooved paths formed on the first plate member and the third plate member. The pressure loss in the flow passage of coolant is reduced by increasing a sectional area of the flow passage by the grooved paths and the opened path of the second plate member without lowering mechanical strength of the device and without increasing a manufacturing cost of the device.

67 Claims, 14 Drawing Sheets

COOLING DEVICE

BACKGROUND OF THE INVENTION

1. Field of the Invention

The present invention generally relates to a cooling device, and in particular to a cooling device for cooling an object, which emits a large amount of heat such as a laser diode (LD) array, to constitute a light source device therewith.

2. Description of Related Art

A laser diode array is used as a light source for exciting a laser medium of a solid-state laser oscillator of high power. Laser oscillation of high efficiency is achieved by exciting the solid-state laser medium by the laser diode array which emits a light beam of acute spectrum instead of a conventional light source such a xenon lamp. A two-dimensional laser diode array (surface illuminating device) formed by stacking one-dimensional laser diode arrays (laser diode bars) having a length of approximately 1 cm and an output power of several tens watt is typically used as the exciting light source of the high power solid-state laser.

For obtaining a high-power light from the LD bars, a cooling device for cooling the LD bars is necessary since a large amount of heat not less than output power of the emitted light is generated by the LD bars. It is required to stack a large number of LD bars in order to obtain high-power output and also it is required to make a pitch of stacking small in order to increase a density of the output power.

Thus, the cooling device for cooling the LD bar is required to allow stacking a larger number of stacked LD bars with a small pitch to form a surface illuminating device with high power and high density of output power. As a flow rate of coolant necessary for cooling the larger number of LD bars increases, there arises a problem of increasing of a pressure loss of the coolant in the cooling device to fail in securing the required flow rate of coolant, to lower a cooling performance of the cooling device.

In view of the above requirements and problems, it is desirable to reduce the pressure loss in the cooling device without increasing a thickness of the device and without lowering a mechanical strength of the device constituted by thin layers. Also, it is necessary to reduce a manufacturing cost of the device since a large number of LD bars are used in the device.

FIG. 1 is an exploded view of a conventional surface light emitting device 1 having a plurality of LD bars. In FIG. 1, a plurality of LD bars 2 are thermally connected to respective cooling devices 3 and the coolant is introduced from a common inlet opening 4 into respective flow passages formed in the cooling devices 3 to flow immediately below the respective LD bars 2 and discharged from an outlet opening 5. With this arrangement, thermal resistance between the LD bars and the coolant is reduced to suppress a temperature rise of the LD bars 2.

In FIG. 1, the LD bras 2 are depicted with exaggerated gaps therebetween, and sealing members for preventing leakage of the coolant from the cooling devices and leads for electrically connecting electrodes of the LD bars 2 which are not connected with the cooling device 3 are not shown.

FIG. 2 is an exploded view of one cooling device 3 for cooling one LD bar 2 in the plurality of cooling devices 3 as shown in FIG. 1. This arrangement is described in German Patent Publication DE 4315580 A1.

Referring to FIG. 2, the cooling device 3 comprises five lamellar plates of first to fifth lamellar plates 6–10 with respective inlet openings 4 and outlet openings 5 formed at corresponding positions. The second lamellar plate 7 is arranged on the first lamellar plate 6 and has a coolant path 12 communicating with the inlet opening and extending from the inlet opening 4 to a front side 11 of the cooling device 3 with its width expanding. The third lamellar plate 8 arranged on the second lamellar plate 7 has a slit 13 formed separately from the inlet opening 4 and the outlet opening 5 along the front side 11 of the cooling device 3 and functions as a coolant path. The fourth lamellar plate 9 arranged on the third lamellar plate 8 has micro channels 14 formed along the front side 11 to be corresponding to the slit 13 and a coolant path 12 communicating with the outlet opening 5 and extending from the micro channels 14 to the outlet opening 5 with its width expanding. The fifth lamellar plate 10 is arranged on the fourth lamellar plate 10.

Each of the thin plates 6–10 is made of material having high thermal conductivity such as copper and the laminated plates 6–10 forms a flow passage of the coolant introduced from the inlet opening 4 to the outlet opening 5 through the micro channels 14. The LD bar, which is arranged on the uppermost layer plate 10 along a front face 11 of the cooling device 3, is cooled by the cooling device 3. The micro channels 14 are formed by laser machining etc. to have approximately 20 μm so as to suppress reduction of a heat exchange efficiency by a boundary layer of the coolant.

In this arrangement shown in FIG. 2, since the thin layer plate 6–10 are formed by the laser machining and stamping, a relatively large number, i.e., five or more of thin plates are necessary for forming one cooling device 3 to raise the number of parts necessary for the cooling device, and a width of the flow passage other than a part at the micro channels is large.

Therefore, thickness of the thin layer plate can not be made thinner in view of mechanical strength of the cooling device and the number of thin plates is large to make the cooling device thick. Further, since it is difficult to form the micro channel by the stamping or chemical etching, the micro channel has to be formed by the laser machining. As the laser machining of high cost is necessary, a cost of the manufacturing of the cooling device is made high.

FIG. 3 is an exploded view of another cooling device for cooling one LD bar, as disclosed in U.S. Pat. No. 5,105,429. As shown in FIG. 3, a cooling device 15 comprises (1) a lower thin layer plate 17 having an inlet opening 4, an outlet opening 5 and a coolant flow path 16 extending from the inlet opening 4 with its width expanding to a front face 11 of the cooling device 15; (2) a middle thin layer plate 18 disposed on the lower thin layer plate 17 and having an inlet opening 4 and an outlet opening 5 corresponding to the inlet opening 4 and the outlet opening 5 of the lower thin layer plate 17 and a slit 13 communicating with the front portion of the flow path 16 of the lower thin layer board 17 to function as a flow path separately from the inlet path 4 and the outlet path; (3) a micro channel formed along the front face 11 of the cooling device; (4) an upper thin layer plate 19 having a coolant flow path 16 extending from the micro channel to the outlet opening 5 with its width expanding to communicate with the micro channel with an outlet opening 5.

The lower thin plate 17 and the upper thin plate 18 are formed by material of silicon as described in U.S. Pat. No. 5,105,429. These boards are joined together to be laminated to form the flow passage for guiding the coolant from the inlet opening 4 to the outlet opening 5 through the micro channel.

The LD bar 2 provided on the upper thin layer plate 19 along an obverse surface 11 of the cooling device 3 is cooled by the cooling device 3. The micro channel 14 is formed by anisotropic etching of silicone to have a width of approximately 25 $\mu$m and a depth of 125 $\mu$m so as to suppress reduction of a heat exchange efficiency by a boundary layer of the coolant.

It is necessary to form the thin layer plates from monocrystal as material for forming the micro channel by the anisotropic etching, and therefore a high pressure can not be applied in the direction of lamination of the thin layer boards since a mechanical strength of the cooling device is low, to make a possibility of leakage of coolant.

Further, since cost of the anisotropic etching is high and the number of parts are large, to raise a manufacturing cost of the cooling device.

FIG. 4 shows another cooling device as disclosed in Japanese Patent Publication No. 10-209531. FIG. 4 is an exploded view of a cooling device 20 for cooling one LD bar. The cooling device 20 comprises three plate members 21–23 having high heat conductance. An upper plate member 23 has a coolant flow path 24 having the same pattern as that of a flow path formed in a lower plate member 21.

The coolant flow path is formed by a plurality of channels 26 separated by ridges 25. The ridges are joined with the middle plate member 22 mechanically and thermally and a plurality of small through holes are formed in the middle plate member 22 instead of a slit so that bridges between the through holes contributes in heat conductivity and in preventing deformation of the middle plate member 22.

With the above arrangement, thermal connection between the three plate members 21–23 is improved so that heat generated by the LD bar is effectively diffused over a wide region of the cooling device 20, to realize an excellent cooling performance without forming micro channels which incurs high cost. Further, the cooling device 20 constituted by only three plate members has a high mechanical strength. However, there remain problems of the pressure loss of the coolant caused by relatively narrow portions, discontinuity of direction of the flow passage and confluent and diffluent of the coolant flow.

SUMMARY OF THE INVENTION

An object of the present invention is to provide a cooling device suitable for cooling a LD bar using coolant, with high cooling capability, small thickness, high mechanical strength, low cost and also low pressure loss of the coolant, which are required for a cooling device for constituting a surface illuminating device of high power and high density of output power.

The cooling device of the present invention enables to flow the coolant at sufficient flow rate by reducing the pressure loss in the flow passage of the coolant in the device, to realize a light source device of small thickness with high cooling capability and high reliability.

According to an aspect of the present invention, a cooling device comprises a first plate member having an inlet opening for introducing the coolant, and a first grooved path formed on one surface thereof extending from one end communicating with the inlet opening to the other end positioned in the vicinity of one peripheral side thereof; a second plate member with one surface arranged on the one surface of the first plate member, having a set of through holes formed at a position corresponding to the other end of the first grooved path of the first plate member; and a third plate member with one surface arranged on the other surface of the second plate member, having an outlet opening for discharging the coolant and a second grooved path formed on the one surface thereof and extending from one end communicating with the outlet opening to the other end positioned to be corresponding to the set of through holes formed in the second plate member. The second plate member further has a third grooved path formed on the one surface thereof, a fourth groove path formed on the other surface thereof and at least one opened path opened from the one surface to the other surface thereof. The first, second and third plate members having the above structure are joined together to be laminated, so that the first, second, third and fourth grooved paths, the set of through holes and the at least one opened path jointly forming the flow passage of the coolant.

With this arrangement, a sectional area of the flow passage of the coolant is increased to reduce the pressure loss in the cooling device without spoiling other requirements for the cooling device.

The second plate member may further have an inlet opening and an outlet opening positioned to be corresponding to the inlet opening and the outlet opening formed in the first plate member and the third plate member, respectively, and the at least one opened path communicates with one of the inlet opening and the outlet opening formed in the second plate member through one of the third grooved path or the fourth grooved path.

One of the inlet opening and the outlet opening which does not communicate with the at least one opened path through one of the third grooved path or the fourth grooved path communicates with one of the third grooved path and the fourth grooved path which does not directly communicate with the at least one opened path.

The second plate member may have at least two opened paths and one of the opened paths communicates with one of the inlet opening and the outlet opening formed in the second plate member through the third grooved path, and another of the opened paths communicates with one of the inlet opening and the outlet opening, which does not communicates with the one of the opened path through the third grooved path, through the fourth grooved path.

With these arrangements, a sectional area of the flow passage in the vicinity of the inlet opening and the outlet opening is increased to further reduce the pressure loss in the flow passage.

The first plate member may further have a fifth grooved path which does not directly communicate with the first grooved path on the one surface thereof, and the third plate member may further have a sixth grooved path which does not directly communicate with the second grooved path on the one surface thereof.

With these arrangements, a sectional area of the flow passage is further increased to reduce the pressure loss in the flow passage.

The second grooved path on the one surface of the third plate member and the fifth grooved path on the one surface of the first plate member may communicate with each other through the at least one opened path formed in the second plate member, and the first grooved path on the one surface of the first plate member and the sixth grooved path formed on the one surface of the third plate member may communicate with each other through the at least one opened path in the second plate member.

With this arrangement, a degree of freedom of arranging the flow passage is increased and a plurality of grooved paths communicate with each other through the opened path to further reduce the pressure loss.

The at least one opened path in the second plate member may have partitions having thickness substantially equal to thickness of the second plate member for dividing the opened path.

One end of each of the partitions is connected with a bottom portion or a ridge of the third grooved path or the fourth grooved path, to be held integrally with the second plate member.

With this arrangement, decrease of a mechanical strength of the cooling device caused by existence of the opened path in the second plate member is prevented.

At least a part of the partitions of the at least one opened path is positioned to be joined with at least a part of ridges formed in the first, second, fifth and sixth grooved paths.

With this structure, the ridges of the grooved path are supported by the partitions formed in the opened path to prevent lowering of mechanical strength of the cooling device due to the existence of the opened paths in the second plate member, and the arrangement of the grooved paths on the first and third plate members positioned to correspond to the opened path.

A plurality of second plate members may be arranged between the first plate member and the third plate member.

With this arrangement, a sectional area of the flow passage of the coolant is further increased to reduce the pressure loss in the flow passage although thickness of the cooling device increases.

At least two of the plurality of second plate members are substantially identical to each other.

With this arrangement, an increase of the manufacturing cost of the cooling device is reduced by suppressing increase of the number of parts.

Each of the plurality of second plate members may have at least one opened path with partitions, and the partitions of adjacent second plate members are arranged at the substantially the same position in respective second plate members to be joined together.

With this arrangement, lowering of the mechanical strength of the cooling device due to the existence of the opened path in the plurality of second plate members is suppressed.

Each of the plurality of second plate members may have a set of through holes with bridge portions therebetween, and the bridge portions of adjacent second plate members are arranged at the same position in respective second plate members to be joined together.

With this arrangement, diffluence or confluence of the coolant in the vicinity of the set of through holes formed in the plurality of second plat members is prevented to reduce the pressure loss in the flow passage and also dispersion of heat from the object of heating through the ridges and the bridging portions is enhanced to increase cooling capability of the cooling device.

A depth of at least one of the first, second, third, fourth, fifth and sixth grooved paths may be set greater than a half of thickness of the plate member on which the grooved path is formed.

With this arrangement, outer peripheries, the grooved paths, the opened paths and the set of through holes of the plate members can be formed at a time by chemical etching to reduce the manufacturing cost, as well as a sectional area of the flow passage of the coolant is further increased to reduce the pressure loss.

The third grooved path and the fourth grooved path have depth greater than a half of thickness of the second plate member and do not communicate with each other.

With this arrangement, a sectional area of the flow path, which is relatively large, is further increased without increasing the manufacturing cost to further reduce the pressure loss.

At least one of the first, second, third, fourth, fifth and sixth grooved paths may have a portion formed by a plurality of grooves divided by ridges which are joined with the plate member confronting the ridges.

With this arrangement, deformation of the grooved paths is prevented by the ridges joined with the confronting plate member, to retain the mechanical strength of the cooling device.

The set of through holes may comprise a series of minute holes with bridging portions therebetween, and the bridging portions may be positioned to correspond to positions of ridges formed at one of the other end of the first grooved path or the other end of the second grooved path to be joined together.

With this arrangement, deformation of the set of the through holes formed in the second plate member is prevented to enhance the mechanical strength of the cooling device, and diffluence or confluence of the coolant in the vicinity of the set of through holes is eliminated to lower the pressure loss in the flow passage. Further, the heat from the object of cooling is effectively diffused by thermal conduction between the bridge portions and the ridges of the first and second plate members and increase of inner area of the flow passage contributing the heat exchange, to enhance the cooling ability.

At least one pair of the ridges formed in the first, second, third, fourth, fifth and sixth grooved paths on confronting surfaces of the first, second and third plate member have portions positioned to confront one another to be joined together.

With this arrangement, the depth of the flow passage formed by the confronting grooves with ridges joined together can be increased and also the width of the grooved path can be enlarged without lowering the mechanical strength of the cooling device since the confronting plate members are supported by the ridges, to increase the sectional area of the flow passage. Further, the heat from the object of cooling is effectively dispersed by thermal conduction between the ridges of the confronting plate members, to enhance the cooling capability of the cooling device.

The pressure loss in the cooling device can be reduced by reducing discontinuity, sharp expansion, sharp reduction of the flow passage, diffluence or confluence of the coolant flow, as well as increasing of the sectional area of the flow passage. This approach is effective particularly in the case where the flow rate of the coolant is required to be increased since the pressure loss caused by the discontinuity, expansion, reduction of the flow passage or diffluence and confluence of the coolant flow is remarkably present when a flow rate of the coolant is high.

Thus, according to another aspect of the present invention, a cooling comprises: a first plate member having an inlet opening for introducing the coolant, and a first grooved path formed on one surface thereof extending from one end communicating with the inlet opening to the other end positioned in the vicinity of one peripheral side thereof; a second plate member with one surface arranged on the one surface of the first plate member, having a set of through holes formed at a position corresponding to the other end of the first grooved path of the first plate member; and a third plate member with one surface arranged on the other surface of the second plate member, having an outlet opening for discharging the coolant and a second grooved path formed on the one surface thereof and extending from one end communicating with the outlet opening to the other end positioned to be corresponding to the set of through holes formed in the second plate member, and at least one of the first grooved path and the second grooved path has a curved portion and a substantially constant width along an extending direction thereof. The first, second and third plate members having the above structure are joined together to be laminated, so that the first and second grooved paths, and the set of through holes jointly forming the flow passage of the coolant.

With the above arrangement, discontinuity, sharp expansion and sharp reduction of the flow passage are reduced to lower the pressure loss in the cooling device.

The second plate member may further have a third grooved path formed on the one surface thereof, and may further have a fourth grooved path formed on the other surface thereof.

With this arrangement, a sectional area of the flow passage is increased to further reduce the pressure loss in the flow passage.

At least a part of the third grooved path may be arranged to confront at least a part of the first grooved path, and at least a part of the fourth grooved path may be arranged to confront at least a part of the second grooved path.

With this arrangement, the sectional area of a part of the flow passage formed by the confronting grooved paths is made twice a part of the flow passage formed by the grooved path and the surface of the confronting plate member, to reduce the pressure loss in the cooling device.

The second plate member may have an inlet opening for introducing the coolant, and the third grooved path may communicate with the inlet opening in the second plate member. Further, the second plate member may have an outlet opening for discharging the coolant, and the fourth grooved path may communicate with the outlet opening in the second plate member.

With this arrangement, a sectional area of the flow passage in the vicinity of the inlet opening and the outlet opening is increased to further reduce the pressure loss in the flow passage.

The second plate member may further have a third grooved path on the one surface thereof and a fourth grooved path the other surface thereof, and at least one of the first, second, third and fourth grooved paths may have a portion formed by a plurality of grooves divided by ridges which are joined with the plate member confronting the ridges, each groove having a constant width along an extending direction thereof.

A width of each of the third and fourth grooved paths is obtained by adding a sum of widths of the grooves and a sum of the ridges between the grooves.

With this arrangement, deformation of the grooved paths is prevented by the ridges joined with the confronting plate member, as well as sudden expansion or reduction of the flow passage is reduced to lower the pressure loss in the cooling device.

A width of at least one of the first and second grooved paths may be set substantially equal to a width of a heating portion of the object of cooling.

Each of the inlet opening and the outlet opening may have a form of a rectangle with one side having a length substantially equal to a width of the grooved path communicating therewith.

Each of the inlet opening and the outlet opening may have a form of a circle having a diameter substantially equal to a width of the grooved path communicating therewith.

With these arrangements, the width of the flow passage from the inlet opening to the outlet opening is made constant to lower the sudden expansion or reduction of the flow passage.

Widths of the first grooved path and the second grooved path are set substantially equal to a width of the set of through holes formed in the second plate member.

With this arrangement, the sudden expansion or reduction of the flow passage is substantially eliminated to lower the pressure loss of coolant in the cooling device.

At least one of the first and second grooved paths may have a curved portion defined by concentric arcs.

With this arrangement, the flow passage is formed by smooth curves without discontinuity to lower the pressure loss in the cooling device.

At least one of the first and second grooved paths may have a plurality of curved portions defined by sets of concentric arcs, each of the concentric arcs in one set being connected with an associated one of the concentric arcs in an adjacent set and having a common tangent at a connection point thereof.

With this arrangement, all of the flow passage is formed by smooth curves without discontinuity except the turning portion in the vicinity of the set of through holes to lower the pressure loss in the cooling device.

Grooves of at least one of the first to fourth grooved paths may have a straight portion defined by straight lines, each of the straight lines being connected with an associated one of the concentric arcs of the curved portion and directed to a tangent of the associated one of the concentric arcs at a connecting point thereof.

With this arrangement also, the discontinuity of direction of the flow passage is eliminated except the portion in the vicinity of the set of through holes where the coolant turns to further reduce the pressure loss.

According to still another aspect of the present invention, a cooling device comprises: a first plate member having an inlet opening for introducing the coolant, and a first grooved path formed on one surface thereof extending from one end communicating with the inlet opening to the other end positioned in the vicinity of one peripheral side thereof; a second plate member with one surface arranged on the one surface of the first plate member, having a set of through holes formed at a position corresponding to the other end of the first grooved path of the first plate member; and a third plate member with one surface arranged on the other surface of the second plate member, having an outlet opening for discharging the coolant and a second grooved path formed on the one surface thereof and extending from one end communicating with the outlet opening to the other end positioned to be corresponding to the set of through holes formed in the second plate member, and the second plate member further has a third grooved path formed on the one surface thereof, a fourth groove path formed on the other surface thereof, and the third grooved path and the fourth grooved path have depth greater than a half of thickness of the second plate member and not directly communicating with each other. The first, second and third plate members having the above structure are joined together to be laminated, so that the first, second, third and fourth grooved paths and the set of through holes jointly forming the flow passage of the coolant.

Although increase of the sectional area of the flow passage is not so large, the pressure loss in the cooling device is reduced without providing the opened path in the second plate member which may lower the mechanical strength of the cooling device.

All of the grooved paths formed on the first, second and third plate members may have depth greater than a half of thickness of the plate member on which grooved path is formed.

With this arrangement, the outer peripheries, the grooved paths, the opened paths, the set of through holes can be formed at a time by chemical etching to greatly reduce the manufacturing cost of the cooling device, as well as the sectional area of the flow passage is increased.

All of the first, second and third plate members may have substantially the same thickness. All of the first, second and third plate members may be are made of the same material.

With these arrangement, all of the plate members can be formed by the same patterning method in the same condition to reduce the manufacturing cost of the cooling device.

All of the first, second and third plate members may be made of metal.

With this arrangement, the cooling device having high cooling capability and high mechanical strength is realized with low cost by manufacturing the plate members with metal having high thermal conductivity, high mechanical strength.

An inlet opening and an outlet opening are formed in all of the first, second and third plate members at the same positions.

With this arrangement, the inlet openings and the outlet openings in respective plate members jointly form a through inlet hole and a through outlet hole in the cooling device. When a plurality of cooling devices are stacked, the through inlet hole and the through outlet hole in respective cooling devices are joined to form common passages for supplying and discharging the coolant.

Outer peripheries of the first, second and third plate members, the grooved paths, the at least one opened paths, the inlet opening, the outlet opening and the set of through holes are formed by chemical etching using photo-resist patterns.

With this arrangement, all of the grooves, through holes, openings and also profiles of the plate members are formed at a time to greatly reduce the manufacturing cost.

A width of the grooved paths or a width of each groove of the grooved paths formed on the first, second and third plate member may be set not less than twice a depth of the grooved path or each groove and not greater than three times the depth of the grooved path or each groove.

With this arrangement, the groove has the narrowest width in forming the groove by the chemical etching which progresses evenly in all radial directions, to realize the cooling device of high cooling capability and mechanical strength with low cost since efficiency of the heat exchange increases the narrower the groove is.

A width of the at least one opened path or a distance of adjacent partitions formed in the at least one opened path is set not less than the thickness of the second plate member and not greater than five times the thickness of the second plate member.

With this arrangement, the opened path has the narrowest width in forming the groove by the chemical etching. The mechanical strength of the cooling device and efficiency of heat exchange are increased by making the width of the opened path narrow.

A thin cooling device with a short stacking pitch is realized by making the thickness of the plate members thinner, but the mechanical strength of the cooling device is lowered. It is desirable to adopt metal having high thermal conductivity such as copper of high pureness, e.g., oxygen-free copper as material of the plate members. In view of the staking pitch and the mechanical strength, it is preferable to set thickness of the first, second and third plate members may not less than 200 $\mu$m and not greater than 500 $\mu$m.

It is preferable that at least one of the grooved paths on the first, second and third plate members, and the at least one opened path and the set of through holes in the second plate member forms macro channels with the smallest sectional area thereof greater than 100 $\mu$m.

With this arrangement, the flow passage of high efficiency of heat exchange is formed by chemical etching with low cost in view of the thickness of the plate member.

All of the grooved paths on the first, second and third plate members and the at least one opened path and the set of through holes in the second plate member forms macro channels with the smallest sectional area thereof greater than 100 $\mu$m.

With this arrangement, the whole flow passage is formed by the chemical etching with low cost to lower the manufacturing cost of the cooling device.

Meanwhile, the mechanical strength is required in the vicinity of the inlet opening and the outlet opening in the cooling device. It is necessary to arrange a sealing member such as an O-ring in the vicinity of the inlet opening and the outlet opening and apply the pressure when a plurality of cooling devices are stacked so as to securely prevent leakage of the coolant. The sufficient mechanical strength is required since leakage of coolant occurs if the cooling device deforms by the pressure applied. On the other hand, the flow passage communicating with the inlet opening and the outlet opening is necessary for supplying and discharging the coolant, and pressure loss increases if the width of the flow passage is small.

In view of the above, a width of a portion of the grooved path communicating with the inlet opening or the outlet opening may be set not less than 300 $\mu$m and not greater than 1000 $\mu$m in the vicinity of the inlet opening or the outlet opening.

With this arrangement, sufficient mechanical strength is realized in the vicinity of the inlet opening and the outlet opening.

When a plurality of cooling devices are stacked with the sealing members therebetween, the through inlet opening and the through outlet opening of respective cooling devices are aligned and connected to form common inlet and outlet passages, to enable to effectively supply and discharge the coolant to and from the plurality of cooling devices. The pressure loss of the coolant in the common inlet and outlet passage is reduced as the areas of the inlet opening and the outlet opening are large. Thus, the coolant of sufficient flow rate is supplied and discharged to and from the plurality of stacked cooling devices, to realize the cooling apparatus having a high cooling capability.

If the areas of the inlet opening and the outlet opening are set large, the area of the plate member is made large, to lower the number of plate members formed from a sheet of a predetermined dimension.

In view of the above, a sum of an area of the inlet opening and an area of the outlet opening is set not less than 20% of an area of a rectangle of the plate member.

With this arrangement, a cooling device with low pressure loss in the common inlet and outlet passages is realized with a low manufacturing cost.

The first, second and third plate members may be joined together by diffusion welding, or soldering with solder material containing Ag, Pb or Sn.

With this arrangement, sufficient bonding strength between the plate members is obtained to realize the cooling device having the required mechanical strength. Particularly in using the soldering with solder material containing Pb or Sn, the manufacturing cost of the cooling device is reduced.

The first, second and third plate members may be previously coated with solder material containing Pb or Sn by electroless plating before joining together.

With this arrangement, unevenness of thickness of the electro plating caused by potential difference in respective portions is avoided to realize stable bonding strength of the stacked plate members.

The first plate member further may have a laser diode bar on the other surface thereof along the peripheral side or the third plate member further has a laser diode bar on the other surface thereof along the peripheral side, to constitute a light source device.

With this arrangement, the light source with a high power output and high reliability is realized.

The laser diode may be electrically and thermally connected to the first plate member or the third plate member through a metal sub-mount having solder layers on both sides thereof.

With this arrangement, the soldering of the laser diode on the cooling device is made easy using the metal sub-mount of low price to reduce the manufacturing cost. Further, stress on the laser diode is reduced to enhance the reliability of the laser diode since the laser diode is not directly soldered on the cooling device which is different in coefficient of thermal expansion.

A plurality of sets of the first plate member, second plate member and third plate members respectively jointed together with the laser diode bars to constitute the light source devices are stacked with sealing members between them around the inlet opening and the outlet opening in a state where a metal plate or layer electrically connected to an electrode of the laser diode bar which is not connected to the first plate member or the third plate member is fixed on the other surface of the first plate member or the other surface of the third plate member through an isolating member except regions near the laser diode bar and the inlet opening and the outlet opening, to constitute surface illuminating device.

With this arrangement, the cooling device for constituting a surface illuminating device having a high power output and a high density of power output and a high reliability is realized.

DETAILED DESCRIPTION OF THE PREFERRED EMBODIMENTS

Figure 1:
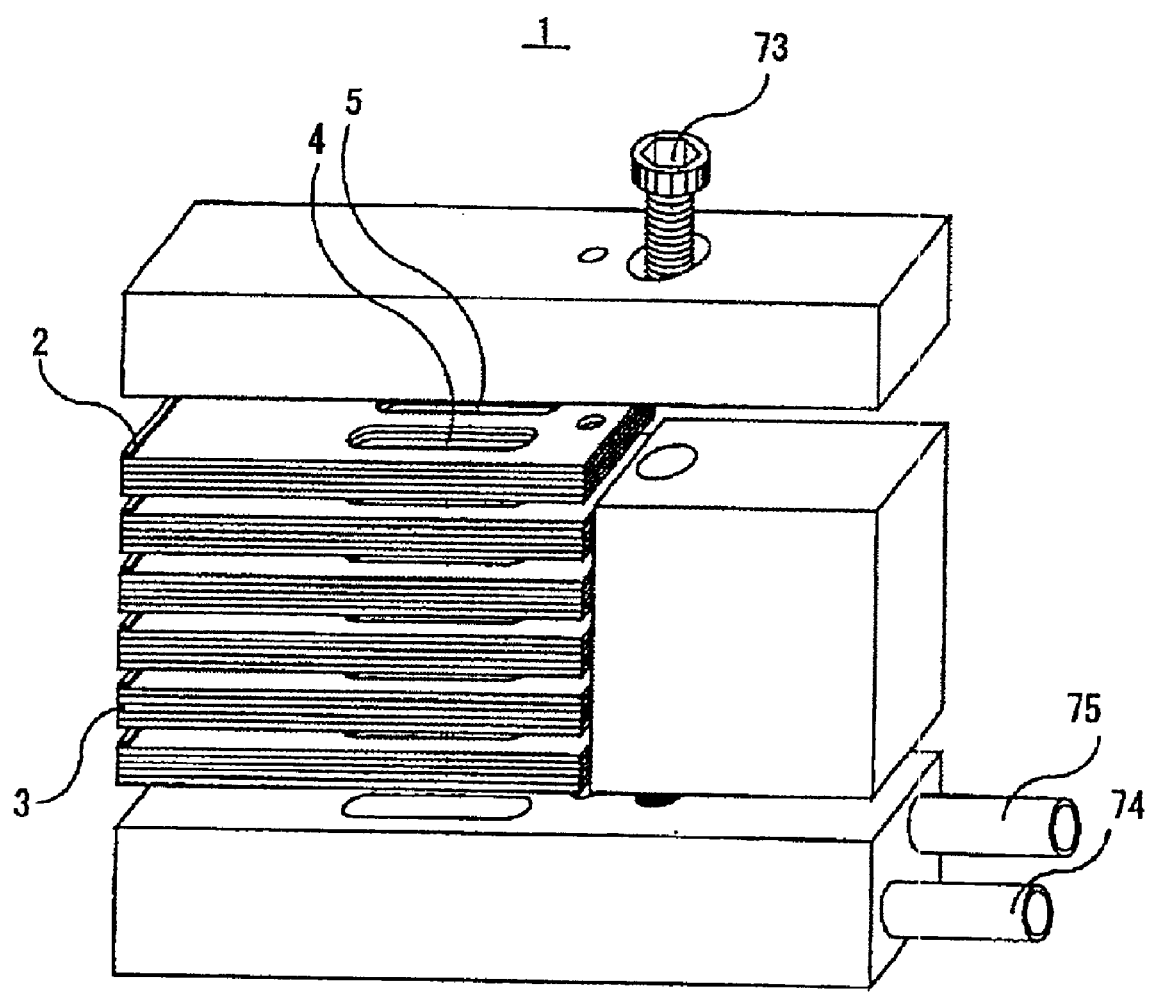
FIG. 1 is an exploded view of a conventional surface illuminating device having a plurality of laser diode bars.
Figure 2:
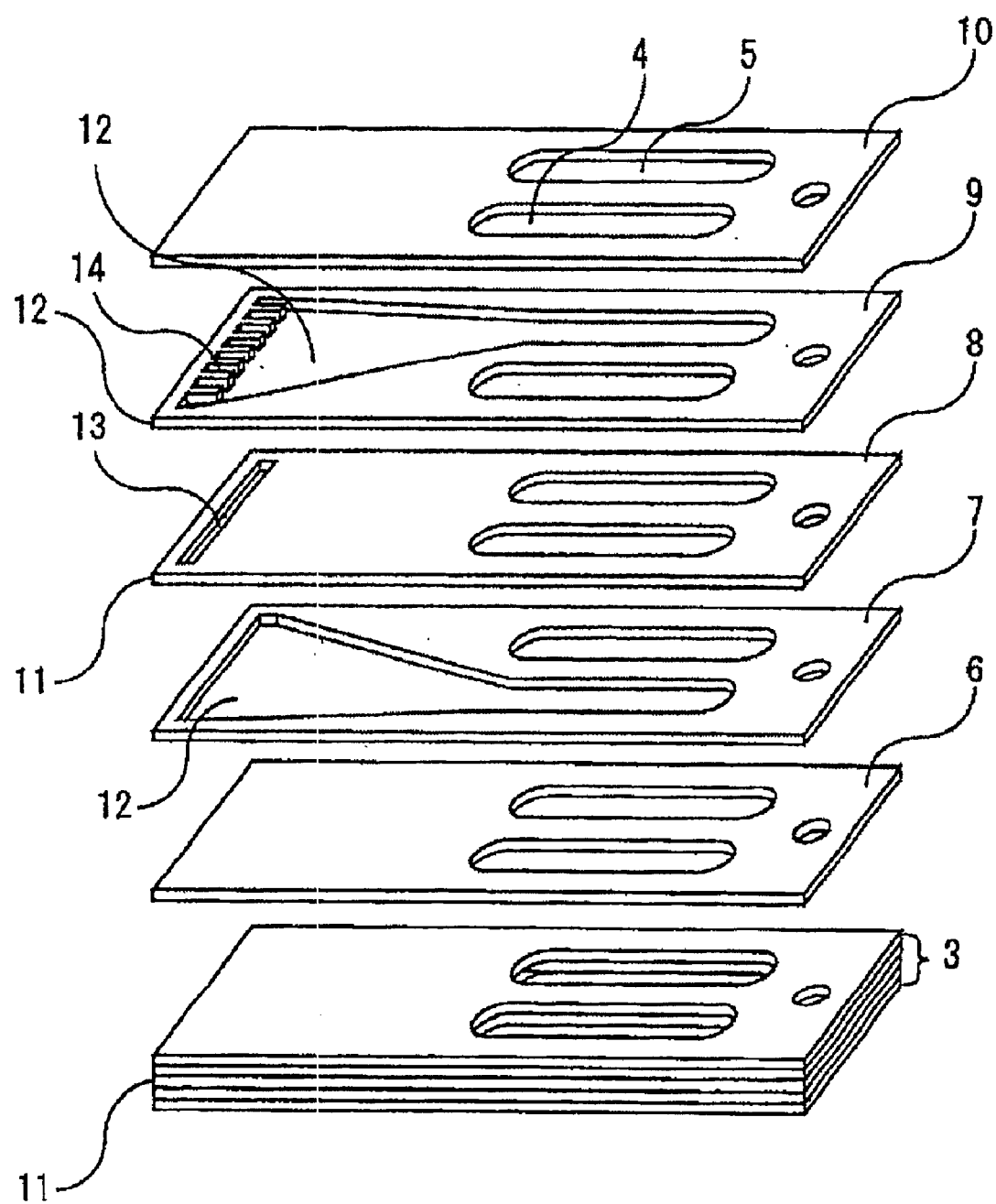
FIG. 2 is an exploded view of a cooling device for one laser diode bar in the surface illuminating device as shown in FIG. 1.
Figure 3:
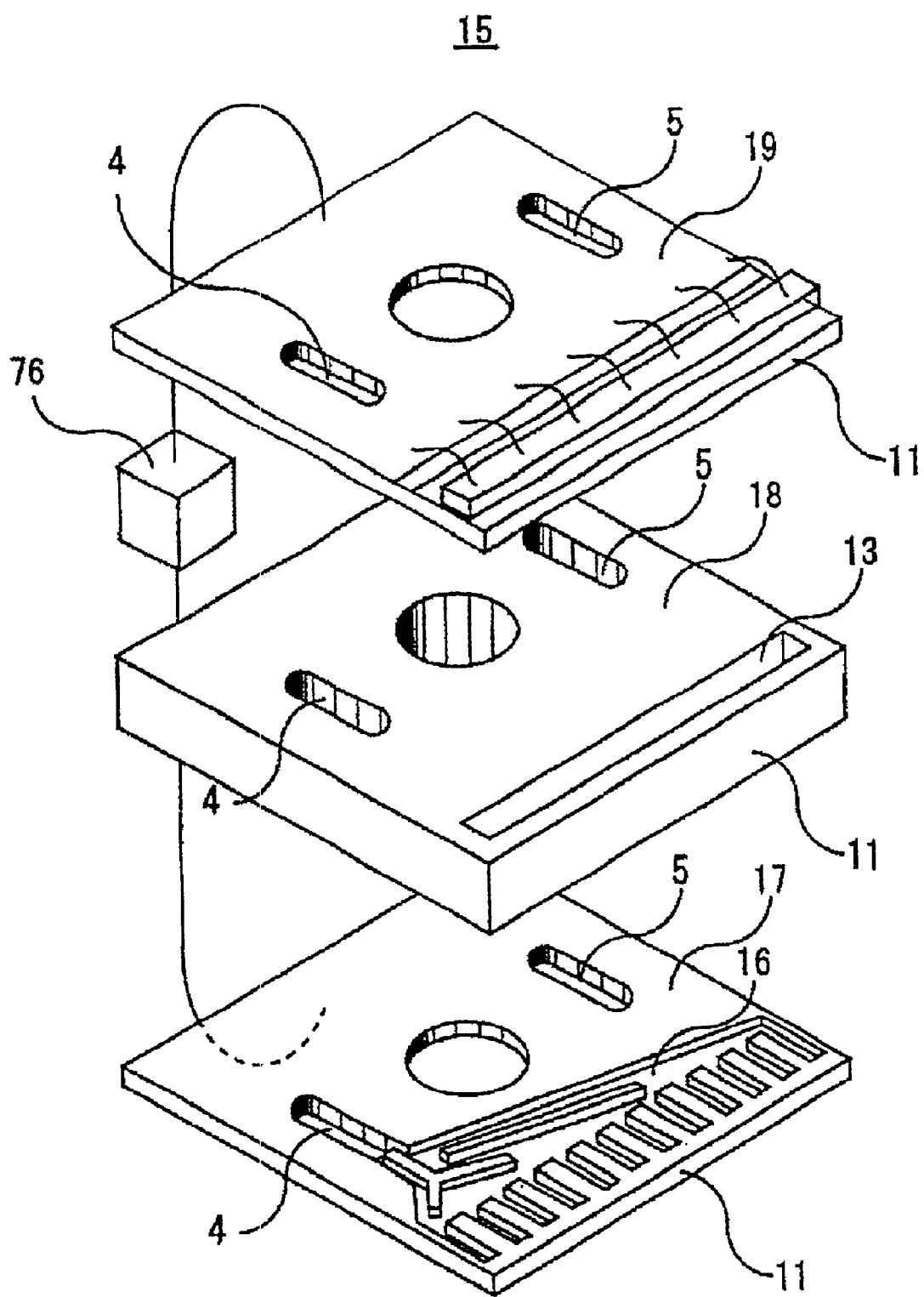
FIG. 3 is an exploded view of another conventional cooling device for one laser diode bar.
Figure 4:
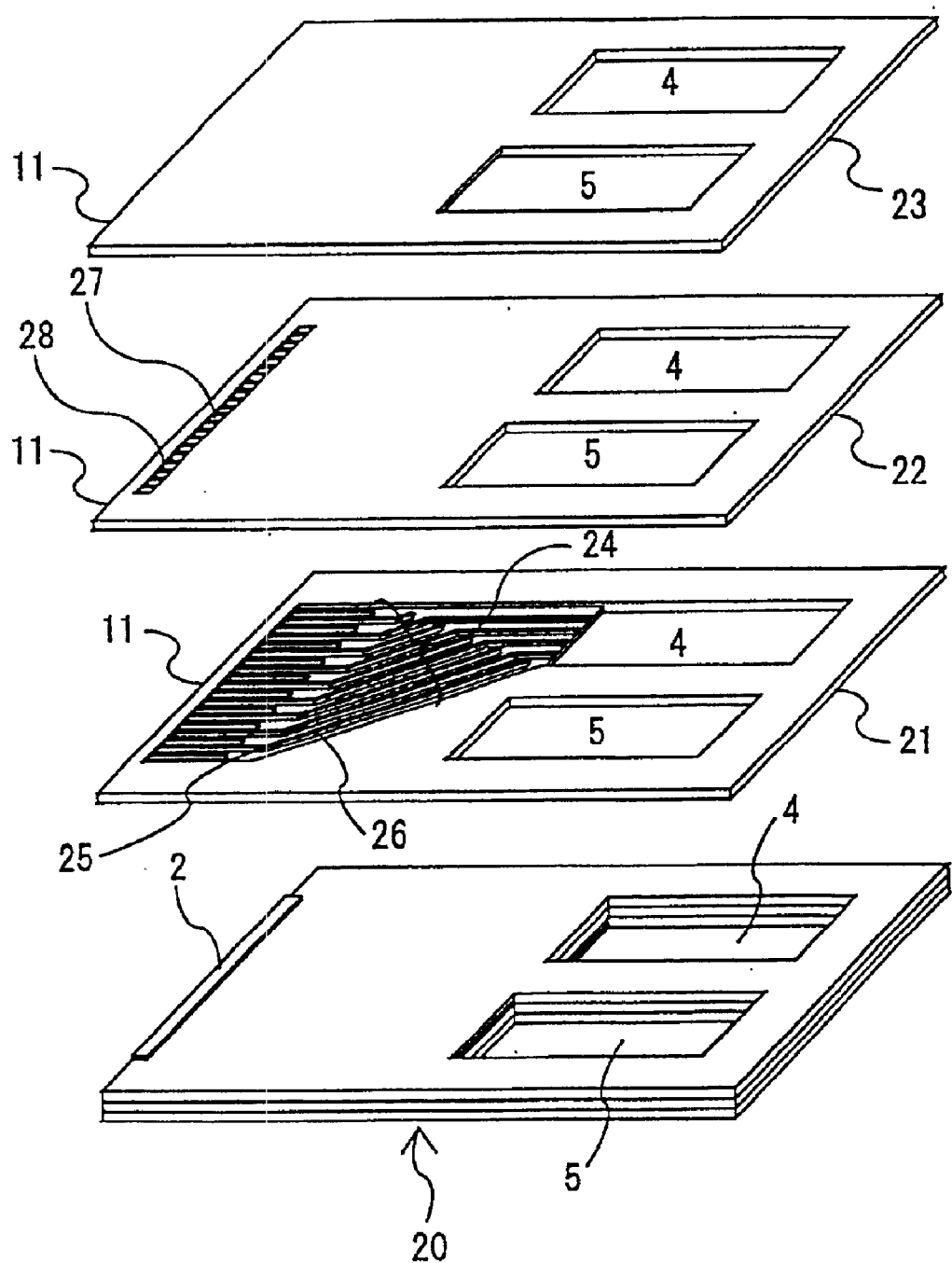
FIG. 4 is an exploded view of still another conventional cooling device for one laser diode bar.

In the following description, the same reference numeral is assigned to elements or portions having the same or equivalent structure or function.

First Embodiment

Figure 5:
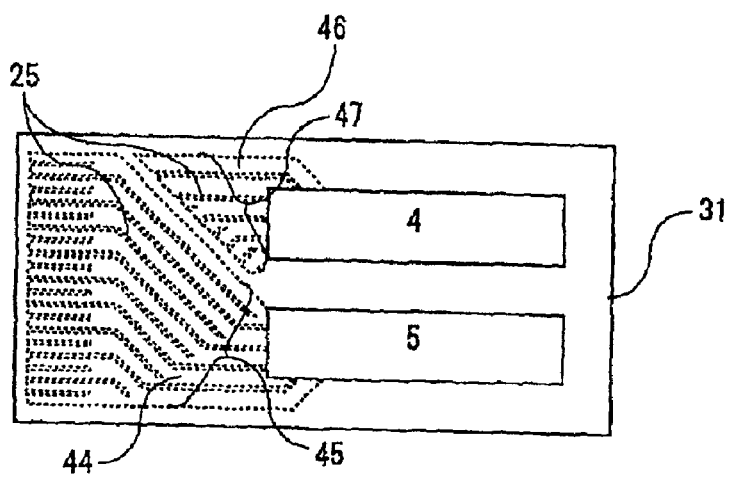
FIG. 5 is a plan view of a third plate member constituting a cooling device according to a first embodiment of the present invention.
Figure 6:
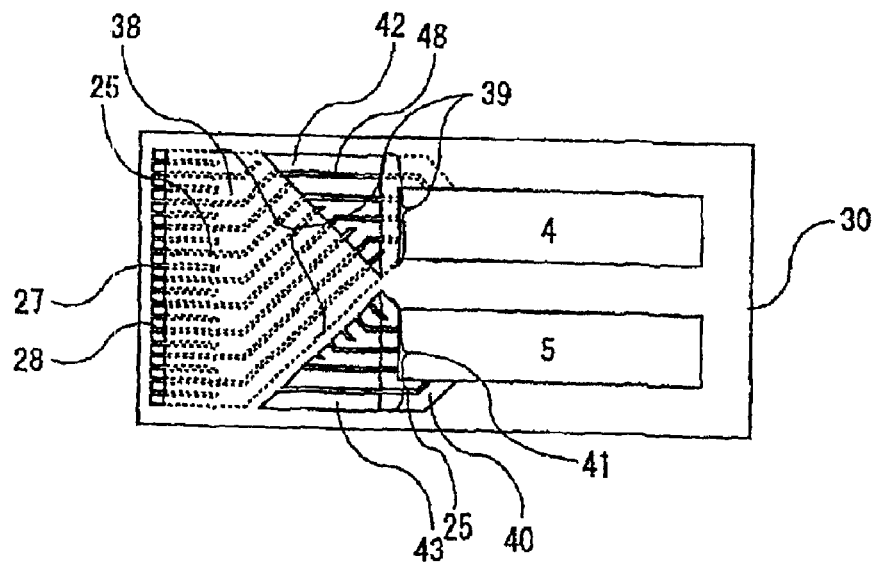
FIG. 6 is a plan view of a second plate member constituting the cooling device according to the first embodiment of the present invention.
Figure 7:
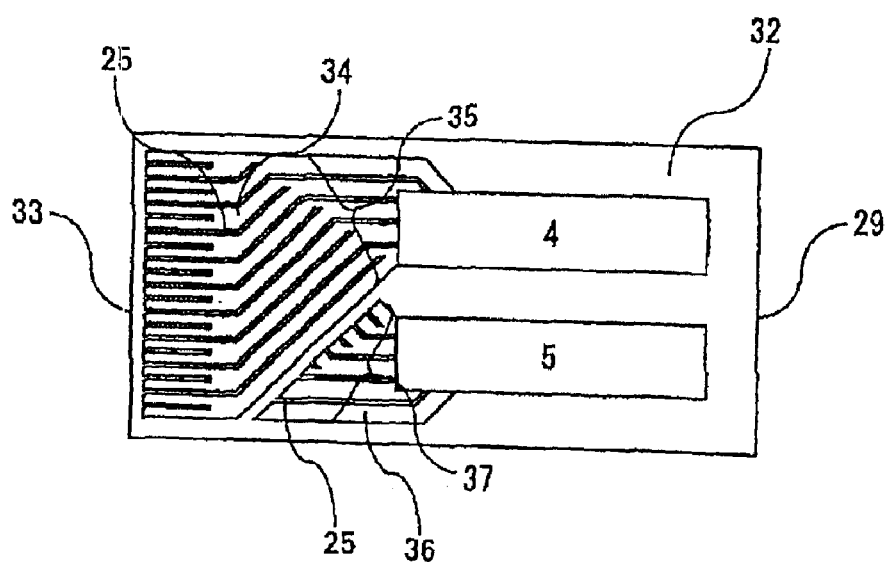
FIG. 7 is a plan view of a first plate member constituting the cooling device according to the first embodiment of the present invention.

FIGS. 5–7 show a first embodiment of a cooling device according to the present invention. The cooling device of this embodiment comprises a first plate member 29 shown in FIG. 7, a second plate member 30 shown in FIG. 6 and a third plate member 31 shown in FIG. 5. The second plate member 30 is arranged on the first plate member 29 such that a reverse surface of the second plate member 30 and an obverse surface 32 of the first plate member 31 are joined together, and the third plate member 31 is arranged on the second plate member 30 such that a reverse surface of the third plate member 31 and an obverse surface of the second plate member 30 are joined together. Thus, the three plate members 29–31 are laminated to jointly form the cooling device. In this and subsequent embodiment, the terms "obverse" and "reverse" are used on the basis of the state of the plate members as depicted in the figures. Grooves formed on the obverse surface of the plate member are indicated by continuous lines and grooves formed on the reverse surface of the plate member are indicated by dotted lines in the figures. Depth of the grooves is less than thickness of the plate member on which the grooves are formed.

The three plate members 29–31 have the same thickness and are made of the same material. The thickness of the plate members is typically 200 μm–500 μm and the plate members are preferably made of metal having high electric conductivity, such as oxygen free copper. An inlet opening 4 for introducing the coolant and an outlet opening 5 for discharging the coolant are formed on each of the plate members 29–31 at the same positions.

A first grooved path 35 and a fifth grooved path 36 are formed on the obverse surface 32 of the first plate member 29 by first grooves 34 and fifth grooves 36, respectively. One end of the first grooved path 35 communicates with the inlet opening 4 and the other end thereof extends to a position in the vicinity of a peripheral side 33 of the first plate member 29. One end of the fifth grooved path 37 communicates with the outlet opening 5 and the other end thereof does not directly communicate with the first grooved path 35.

A set of through holes 27 with bridging portions 28 therebetween are formed in the second plate member 30 at a position corresponding to the position of the other end of the first grooved path 35 formed on the first plate member 29. A third grooved path 39 is formed on the reverse surface of the second plate member 30 by third grooves 38, and a fourth groove path 41 is formed on the obverse surface of the second plate member 30 by fourth grooves 40. The third grooved path 39 formed on the reverse surface of the second plate member 30 and the fourth grooved path 41 formed on the obverse surface of the second plate member 30 do not directly communicate with each other.

A first opened path 42 and a second opened path 43 are formed through the second plate member 30 from the obverse surface to the reverse surface thereof. The first opened path 42 communicates with the input opening 4 through the third grooved path 39, and the second opened path 43 communicates with the outlet opening 5 through the fourth grooved path 41.

A second grooved path 45 and a sixth grooved path 47 are formed on the reverse surface of the third plate member 31 by second grooves 44 and sixth grooves 46, respectively. One end of the second grooved path 45 communicates with the outlet opening 5 and the other end thereof extends to a position corresponding to the position of the set of through holes 27 formed in the second plate member 30. One end of the sixth grooved path 47 communicates with the inlet opening 4 and the other end thereof does not directly communicate with the second grooved path 45.

The first grooved path 35 formed on the obverse surface of the first plate member 29 and the sixth grooved path 47 formed on the reverse surface of the third plate member 31 communicates with each other through the first opened path 42 formed in the second plate member 30. Similarly, the second grooved path 45 formed on the reverse surface of the third plate member 31 and the fifth grooved path 37 formed on the obverse surface of the first plate member 29 communicates with each other through the second opened path 43 formed in the second plate member 30.

The third groove path 39 on the reverse surface of the second plate member 30 is arranged to confront the first grooved path 35 on the obverse surface of the first plate member 29, and the fourth grooved path 41 on the obverse surface of the second plate member 30 is arranged to confront the second grooved path 45 on the reverse surface of the third plate member 31.

Ridges 25 are formed between the first to sixth grooves 34, 44, 38, 40, 36 and 46 of the first to sixth grooved paths 35, 45, 39, 41, 37 and 47, respectively. These ridges 25 are joined with surfaces or ridges of the confronting plate member when the three plate members 29–31 are joined together. The ridges 25 of the third grooved path 39 are joined with the ridges 25 of the first grooved path 35, and the ridges 25 of the fourth grooved path 41 are joined with the second grooved path 45.

Further, the bridge portions 28 between the set of through holes 27 formed in the second plate member 30 are positioned to confront the ridges 25 of the first grooves 34 on the first plate member 29 and the second grooves 44 on the third plate member 31 to be joined with these ridges when the three plate members 29–31 are joined together.

Partitions 48 having the same thickness as the second plate member 30 are formed in the first and second opened paths 42 and 43 of the second plate member 30. At least one end of each partition 48 of the first opened path 42 is connected with a bottom portion and an associated ridge 25 of the third grooved path 39, so that the partitions 48 are held integrally with the second plate member 30. One end of each partition 48 of the second opened path 43 is connected with a bottom portion and an associate ridge 25 of the fourth grooved path 41 and the other end thereof is connected with the second plate member 29 at the end of the opened path 43, so that the partitions 48 are held integrally with the second plate member 30. The partitions 48 of the first opened path 42 are joined with the ridges 25 of the first grooved path 35 formed on the first plate member 29 and the sixth grooved path 47 formed on the third plate member when the three plate members 29–31 are joined together. Similarly, the partitions 48 of the second opened path 43 are joined with the ridges 25 of the second grooved path 45 formed on the third plate member 31 and the fifth grooved path 37 formed on the first plate member 29 when the three plate members 29–31 are joined together.

A depth of each groove of the first to sixth grooved paths 35, 45, 39, 41, 37 and 47 is set greater than a half of the thickness of each plate member on which the grooved path is formed. By setting the depths of the grooves in this manner, the plate members 29–31 with the grooves and openings can be easily formed by a chemical etching process.

In particular, photo-resist is applied to a metal sheet having high heat-conductivity such as oxygen free copper, and the metal sheet with the photo-resist is exposed to light and developed to form a photo-resist pattern thereon. Then, the metal sheet is subjected to chemical etching on both surfaces to form grooves of depth greater than a half of the thickness of the metal sheet. With this etching process, grooves are formed at an area without photo resist on one surface of the metal sheet, and peripheral edges, through holes and openings are formed at an area without photo-resist on both surfaces of the metal sheet. With this technique, peripheral edges of the plate members 29–31, the grooved paths 35, 45, 39, 41, 37 and 47, the opened paths 42 and 43, the inlet opening 4, the outlet opening 5 and the set of through holes 27 are formed at a time.

The areas with photo-resist on both surfaces are not etched to maintain the original thickness of the metal sheet. In practice, a plurality of plate members with the grooves, openings, through holes may be formed at a time from one metal sheet, with bridges remained to connect the plate members with one another to be easily cut off to separate the plate members from one another afterwards, to reduce the manufacturing cost.

Since the thickness of the metal sheet and thus the plate members is typically 200 $\mu$m to 500 $\mu$m, the depth of each groove is made greater than 100 $\mu$m and the width of each groove is twice the depth of each groove since the chemical etching evenly progresses in all radial directions on a metal sheet.

It is desirable to increase an inner wall area of the flow passage which contributes the heat-exchange between the object of cooling and the coolant as large as possible, especially at the region where heat is absorbed from the object of cooling, to enhance an effectiveness of the heat-exchange. Thus, it is desirable that a width of the groove is small at that region. In view of the above, the width of the groove at the region in the vicinity of the object of cooling is set greater than twice the depth of the groove but less than three time the depth of the grooves.

It is not necessary to set the width of the groove at regions in the vicinity of the inlet opening 4 and the outlet opening 5 so small. Since sealing members are arranged at these regions and high pressure is applied thereto, the width of the groove at these regions is set not greater than 1000 $\mu$m. A width of each of the opened paths 42 and 43 divided by partitions 48 is not less than the thickness of the plate member for the same reason as that of the grooved path, and is preferably set not greater than three-times the thickness of the plate member in view of the mechanical strength. With respect to the set of through holes 27, a length of a side of rectangle of each through hole is set not less than the thickness of the plate member for the same reason as that of the grooved path.

Thus, sectional dimensions of all the grooves of the grooved paths (widths and depths), sectional dimensions of all the opened paths (widths and depths, i.e. thickness of the plate member) and sectional dimensions of all the through holes (lengths of sides of rectangles) are greater than 100 $\mu$m, to form so called "macro channels".

The three plate members 29–31 have the same rectangular profiles. The peripheral side 33 of each plate member has length of 11.6 mm, and a side perpendicular to the peripheral side 33 has length of 24 mm in this embodiment. The inlet opening 4 and the outlet opening 5 have the same rectangular shape of 2.8 mm×12 mm. The sum, 67.2 mm$^2$, of the areas of the inlet opening 4 and the outlet opening 5 is 24.1% of the area of the rectangle of the plate member.

The three plate members 29–31 can be joined together by diffusion welding, or soldering with silver (Ag), lead (Pb) or tin (Sn), or solder material containing silver (Ag), lead (Pb) or tin (Sn). In this embodiment, the three plate members 29–31 are joined by the soldering in view of low cost. In this case, it is preferable to previously coat the plate members 29–31 with solder by electroless plating before the soldering.

Second Embodiment

Figure 8:
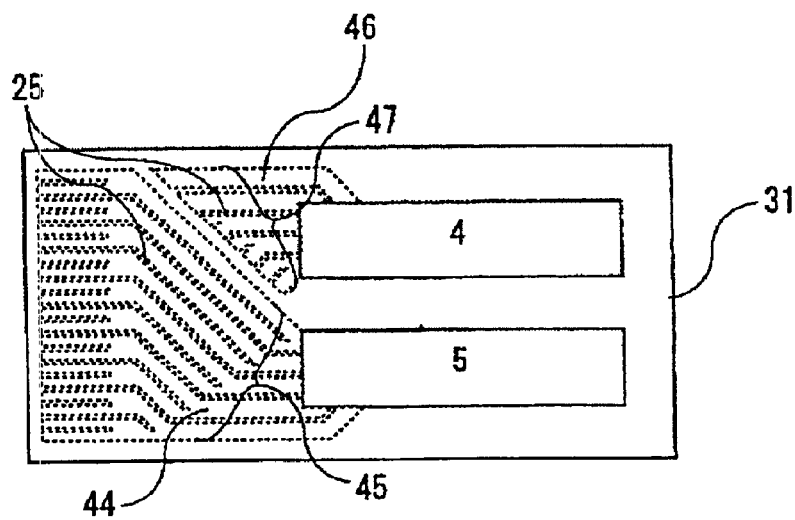
FIG. 8 is a plan view of a third plate member constituting a cooling device according to a second embodiment of the present invention.
Figure 9:
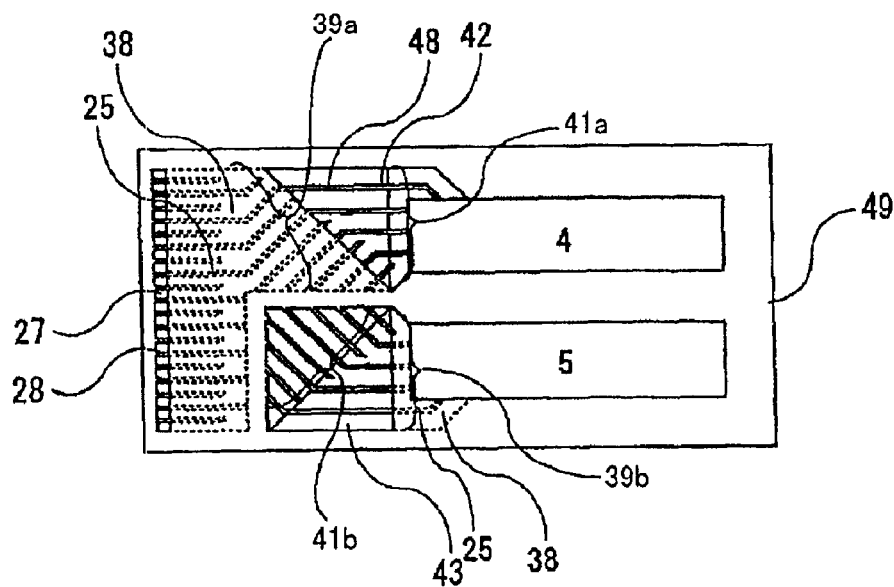
FIG. 9 is a plan view of a second plate member constituting the cooling device according to the second embodiment of the present invention.
Figure 10:
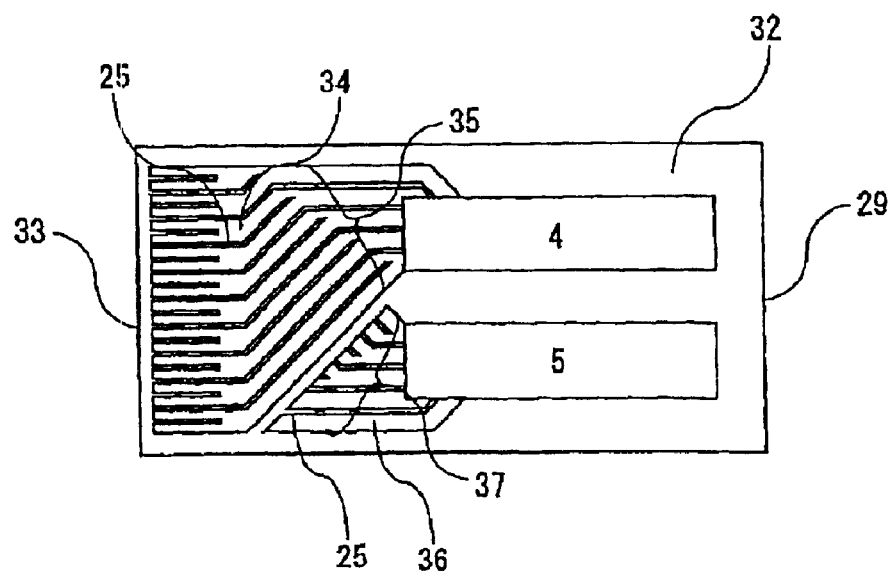
FIG. 10 is a plan view of a first plate member constituting the cooling UT device according to the second embodiment of the present invention.

FIGS. 8–10 show plate members constituting a cooling device according to a second embodiment of the present invention.

The cooling device of this embodiment comprises the first plate member 29 shown in FIG. 10, a second plate member 49 shown in FIG. 9 and the third plate member 31 shown in FIG. 8. The first and third plate members 29 and 31 are identical to the first and third plate members shown in FIGS. 7 and 5 in the first embodiment, respectively. The second plate member 49 of this embodiment has a structure for improving symmetricalness of the flow passage with respect to a longitudinal central plane perpendicular to the surfaces of the plate members in comparison with the second plate member 30 in the first embodiment.

In the second plate member 49, a third grooved paths 39$a$ formed on a reverse surface thereof communicates with a fourth grooved path 41$a$ formed on an obverse surface thereof through the first opened path 42. The fourth grooved path 41$a$ directly communicates with the inlet opening 4. Similarly, a fourth grooved path 41$b$ formed on the obverse surface the second plate member 49 communicates with a third grooved path 39b formed on the reverse surface through the second opened path 43. The third grooved path 39b directly communicates with the outlet opening 5.

Thus, the third grooved paths 39a and 39b do not directly communicate with each other, and the fourth grooved paths 41a and 41b do not directly communicate with each other. One of the two third grooved paths 39a and 39b is used for a supplying path and the other is used for a discharging path of the coolant. Similarly, one of the two fourth grooved paths 41a and 41b is used for a supplying path and the other is used for a discharging path of the coolant. Ridges 25 of the third grooved paths 39a and 39b formed on the reverse surface of the second plate member 49 are joined with the ridges 25 of the first and fifth grooved paths 35 and 37 formed on the obverse surface of the first plate member 29, respectively, when the first and second plate members 29 and 49 are joined together. Similarly, ridges of the fourth grooved path 41a and 41b formed on the obverse surface of the second plate member 49 are joined with the ridges 25 of the sixth grooved path 47 and the second grooved path 45 formed on the reverse surface of the third plate member 31, respectively, when the second and third plate members 49 and 31 are joined together.

In this embodiment, symmetricalness of the flow passage of the coolant with respect to a longitudinal central plane perpendicular to the surfaces of the plate members is improved, and therefore pressure losses in respective divided paths of the flow passage from the inlet opening 4 to the outlet opening 5 are made uniform. Thus, flow rates of the coolant flowing in respective through holes 27 formed in the second plate member 49 are made uniform, so that the object of cooling is uniformly cooled.

Third Embodiment

Figure 11:
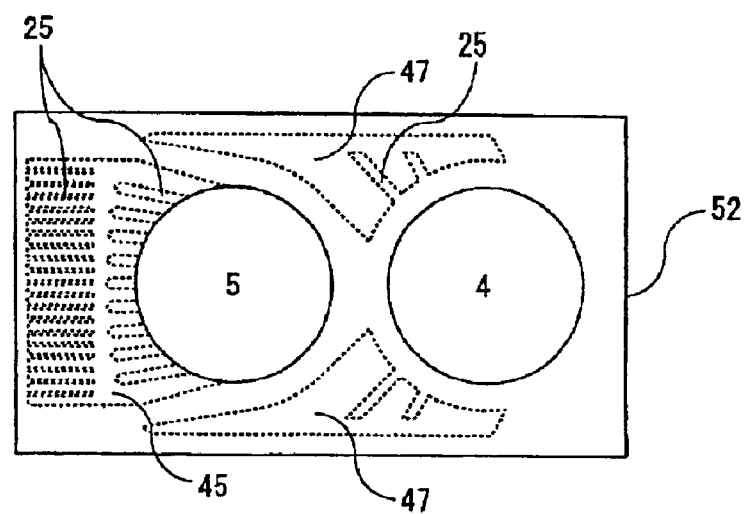
FIG. 11 is a plan view of a third plate member constituting a cooling device according to a third embodiment of the present invention.
Figure 12:
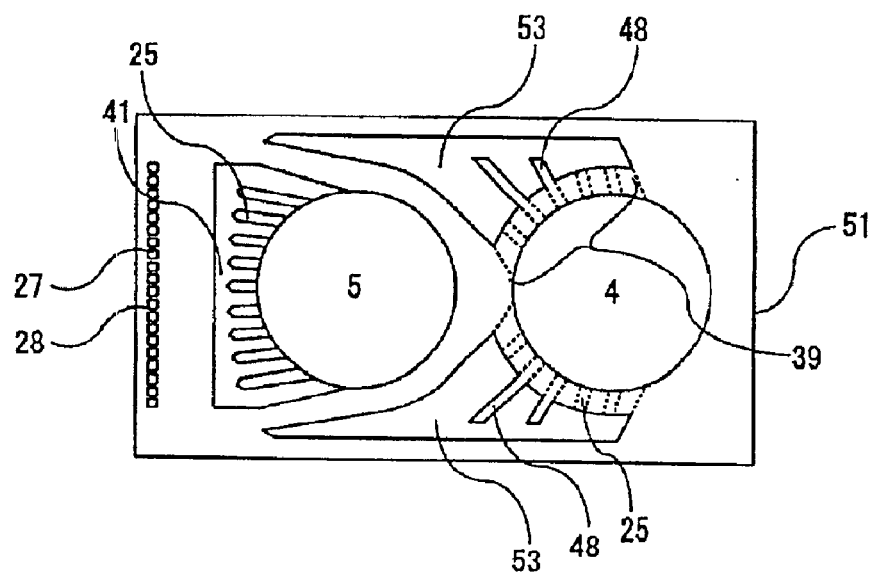
FIG. 12 is a plan view of a second plate member constituting the cooling device according to the third embodiment of the present invention.
Figure 13:
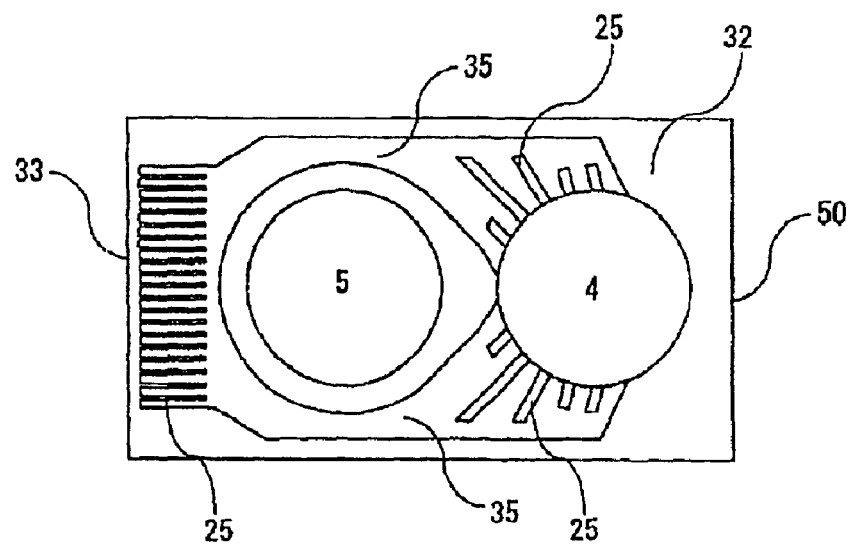
FIG. 13 is a plan view of a first plate member constituting the cooling device according to the third embodiment of the present invention.

FIGS. 11–13 show plate members constituting a cooling device according to a third embodiment of the present invention. The cooling device of this embodiment comprises a first plate member 50 shown in FIG. 13, a second plate member 51 shown in FIG. 12 and a third plate member 52 shown in FIG. 11. The second plate member 51 is arranged on the first plate member 50 such that a reverse surface of the second plate member 51 in FIG. 12 and an obverse surface 32 of the first plate member 50 in FIG. 13 are joined together, and the third plate member 52 is arranged on the second plate member 51 such that a reverse surface of the third plate member 52 in FIG. 11 and an obverse surface of the second plate member 51 in FIG. 12 are joined together, to be laminated to jointly form the cooling device. An inlet opening 4 and an outlet opening 5 are formed on each of the plate members 50–52 at the same positions.

A first grooved path 35 with one end communicating with the inlet opening 4 and the other end positioned in the vicinity of a peripheral side 33 is formed on an obverse surface of the first plate member 50. The first grooved path 35 is divided by ridges 25 which are formed only in the vicinity of the other end thereof and the inlet opening 4. The ridges in the vicinity of the other end of the first grooved path 35 are formed for increasing area of inner walls of the flow path to raise efficiency of the heat exchange between the object of cooling and the coolant and for enhancing mechanical strength of the plate member 51 in this region to prevent lowering of contact between the object of cooling and the cooling device by possible deformation of the plate member 51. The ridges in the vicinity of the inlet opening 4 are formed for increasing the mechanical strength in this region where a sealing member for preventing leakage of coolant is arranged and high pressure is applied, so as to prevent leakage of coolant by a possible deformation in this region.

A set of through holes 27 with bridging portions 28 therebetween are formed in the second plate member 51 at a position corresponding to the position of the other end of the first grooved path 35 formed on the first plate member 50. A third grooved path 39 is formed on a reverse surface of the second plate member 51 which is joined with an obverse surface of the first plate member 50 and a fourth grooved path 41 is formed on an obverse surface of the second plate member 51 which is joined with a reverse surface of the third plate member 52. Opened paths 53 are formed in the second plate member 51 to communicate with the inlet opening 4 through the third grooved path 39. The third grooved path 39 and the fourth grooved path 41 do not directly communicate with each other. Ridges 25 are formed in the vicinity of the inlet opening 4 in the third grooved path 39 to connect partitions 48 in the opened paths 53, and ridges 25 are formed in the vicinity of the outlet opening 5 in the fourth grooved path 41 for the same reason described regarding the first plate member 50.

A second grooved path 45 with one end communicating with the outlet opening 5 and the other end extending to a position corresponding to the set of through holes 27 of the second plate member 51 is formed on a reverse surface of the third plate member 52. Further, a sixth grooved path 47 is formed separately from the second grooved path 45 on the reverse surface of the third plate member 52.

The first grooved path 35 formed on the obverse surface of the first plate member 50 and the sixth grooved path 47 formed on the reverse surface of the third plate member 52 communicate with each other through the open paths 53 formed in the second plate member 51. The second grooved path 45 is divided by ridges 25 only in the vicinity of the other end thereof and in the vicinity of the outlet opening 5, and the sixth grooved path 47 is divided by ridges 25 only in the vicinity of the inlet opening 47 for the reason as described.

The third grooved path 39 on the reverse surface of the second plate member 51 is formed to conform with the first grooved path 35 of the first plate member 50, and the fourth grooved path 41 is formed to conform with the second grooved path 45 formed on the reverse surface of the third plate member 52. The ridges 25 formed in the grooved paths and the partitions 48 in the opened paths 53 in the first to third plate members 50–52 are joined with the surface or the ridges of the confronting plate member when the three plate members 50–52 are joined together.

Ridges 25 in the first grooved path 35 of the first plate member 50 are joined with the ridges 25 in the third grooved path 39 and the partition 48 in the opened path 53 of the second plate member 51, and the ridges 25 of the sixth grooved path 47 are joined with the partitions 48. The ridges 25 of the fourth grooved path 41 of the second plate member 51 are joined with the ridges 25 in the second grooved path 45 of the third plate member 52. The bridging portions 28 between the through holes 27 of the second plate member 51 are arranged to confront the ridges 25 of the first grooved path 35 of the first plate member 50 and the ridges 25 of the second grooved path 45 of the third plate member 52 to be joined with the these ridges 25 when the three plate members 50–52 are joined together.

The partitions 48 formed in the open flow path 53 of the second plate member 51 has the same thickness as the plate member 51. One end of each partition 48 is connected with a bottom portion and the ridge 25 of the third grooved path 39 to be held integrally with the second plate member 51.

In this embodiment, a portion of the flow passage from the through holes 27 to the outlet opening 5 for discharging the coolant is made short and therefore a pressure loss of the coolant in the discharging flow passage is reduced. Accordingly, in order to increase a sectional area of a portion of the flow passage for supplying the coolant from the inlet opening 4 to the through holes 27, the open paths 53 for the supplying flow passage are provided in the second plate member 51 but a fifth grooved path for the discharging flow passage is not provided in the first plate member 50.

A depth of each groove of the first, second, third, fourth and sixth grooved paths 35, 45, 39, 41 and 47 is set greater than a half of the thickness of each plate member on which the grooved path is formed. With this setting of the depths of the grooves, peripheral edges of the plate members, the grooved paths, the opened paths, the inlet opening, the outlet opening and the set of through holes can be formed at a time, as described with respect to the first embodiment.

Since the thickness of the plate members, i.e., the material metal sheet is typically 200 $\mu$m to 500 $\mu$m, the depth of each groove is made greater than 100 $\mu$m. The width of each groove in a region near the object of cooling is set not less than twice the depth of each groove and not greater than three times the depth of each groove, and the width of each groove in a region near the inlet opening 4 and the outlet opening 5 is set not greater than 1000 $\mu$m.

The width of the opened path 53 and also a length of a side of a rectangular cross-section of each through hole 27 is not less than the thickness of the plate member. Thus, sectional dimensions of all the grooves of the grooved paths (widths and depths), sectional dimensions of all the opened paths (widths and depths, i.e. thickness of the plate member) and sectional dimensions of all the through holes (lengths of sides of rectangles) of the plate members 50–52 are greater than 100 $\mu$m, to form so called "macro channels".

The three plate members 50–52 have the same rectangular profiles. The peripheral side 33 of each plate member has length of 14 mm, and a side perpendicular to the peripheral side 33 has length of 25 mm in this embodiment. The inlet opening 4 and the outlet opening 5 have the same circular shape with a diameter of 8 mm. The sum, 100.5 mm$^2$, of the areas of the inlet opening 4 and the outlet opening 5 is 28.7% of the area, 350 mm$^2$, of the rectangle of the plate member.

In the cooling device of this embodiment, symmetricalness of the flow passage with respect to a longitudinal central plane perpendicular to the surfaces of the plate members is further improved in comparison with the cooling device of the second embodiment. Further, since ridges are not provided at regions which are adjacent to regions divided by the ridges 25 of the first and second grooved paths 35 and 45 in the vicinity of the set of through holes 27, pressures in respective grooved paths are made uniform to flow the coolant at the same flow rate in the respective through holes 27.

Thus, the object of cooling attached in the vicinity of the through holes 27 is cooled uniformly. Further, since the inlet opening 4 and the outlet opening 5 have circular shapes, commonly used O-rings are adopted for sealing regions around the openings to securely prevent leakage of the coolant.

Fourth Embodiment

Figure 14:
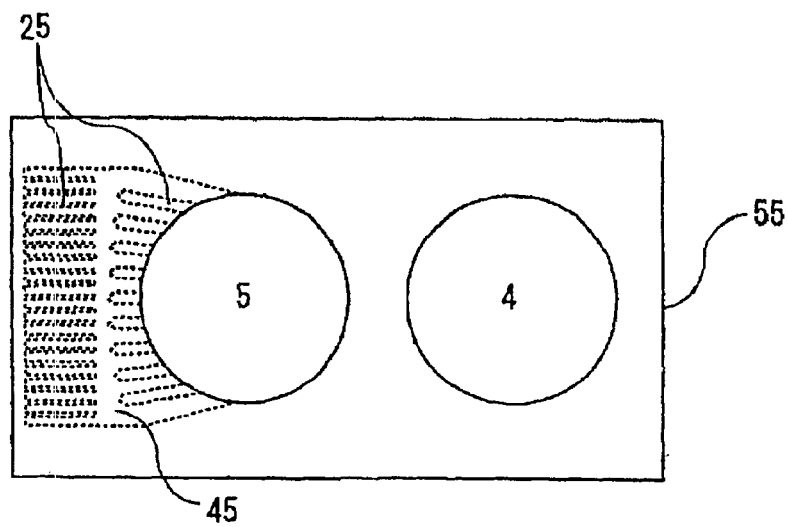
FIG. 14 is a plan view of a third plate member constituting a cooling device according to a fourth embodiment of the present invention.
Figure 15:
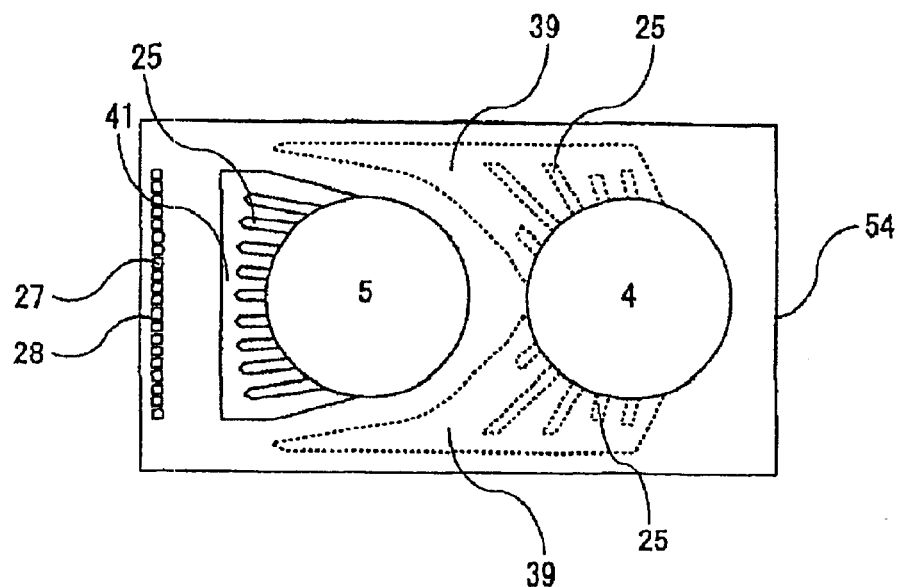
FIG. 15 is a plan view of a second plate member constituting the cooling device according to the fourth embodiment of the present invention.
Figure 16:
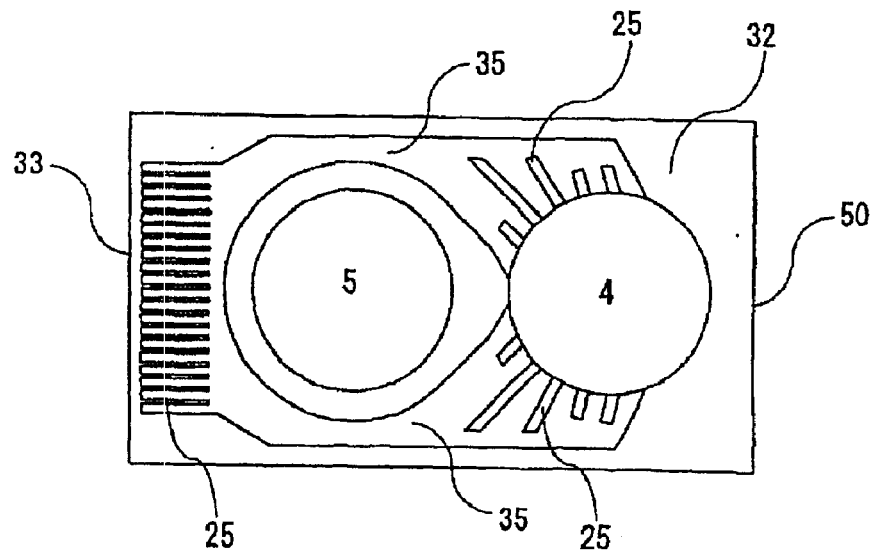
FIG. 16 is a plan view of a first plate member constituting the cooling device according to the fourth embodiment of the present invention.

FIGS. 14–16 show plate members constituting a cooling device according to a fourth embodiment. A first plate member 50 shown in FIG. 16 is identical to the first plate member 50 in the third embodiment as shown in FIG. 13. A second plate member 54 as shown in FIG. 15 is different form the second plate member 51 of the third embodiment as shown in FIG. 12 in that there is not formed an opened path in the second plate member 54. A third plate member 55 as shown in FIG. 14 is different form the third plate member 52 of the third embodiment as shown in FIG. 11 in that a sixth grooved path 47 formed on the third plate member 52 is not formed in the third plate member 55.

A third grooved path 39 is formed on a reverse surface of the second plate member 54, which is arranged on an obverse surface of the first plate member 50, to communicate with the inlet opening 4. A fourth grooved path 41 is formed on an obverse surface of the second plate member 54, which is arranged on a reverse surface of the third plate member 55, to communicate with the outlet opening 5. The third grooved path 39 and the fourth grooved path 41 have depth greater than a halt of thickness of the second plate member 54 and are not directly communicating with each other.

Ridges 25 of the third grooved path 39 are arranged to confront ridges 25 of the first grooved path 35 of the first plate member 50, and ridges 25 of the fourth grooved path 41 are arranged to confront ridges 25 of the second grooved path 45.

Although a sectional area of a portion of the flow passage for supplying the coolant in this embodiment is less than that of the cooling device of the third embodiment, the mechanical strength of the cooling device is enhanced to securely prevent a leakage of the coolant which is possibly caused by deformation of the cooling device, since there is not provided any opened path in the second plate member 54.

Fifth Embodiment

Figure 17:
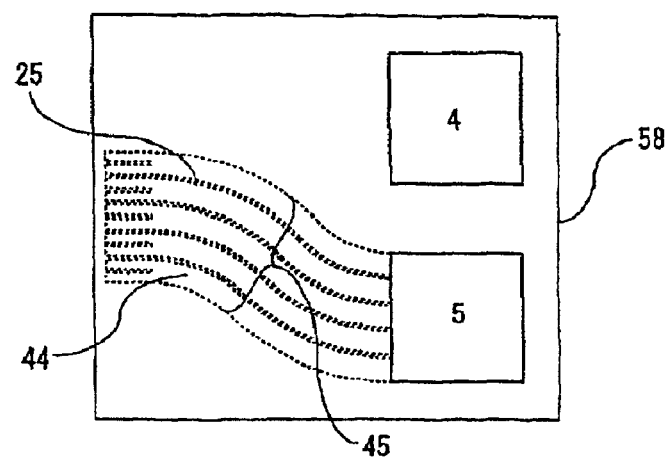
FIG. 17 is a plan view of a third plate member constituting a cooling device according to a fifth embodiment of the present invention.
Figure 18:
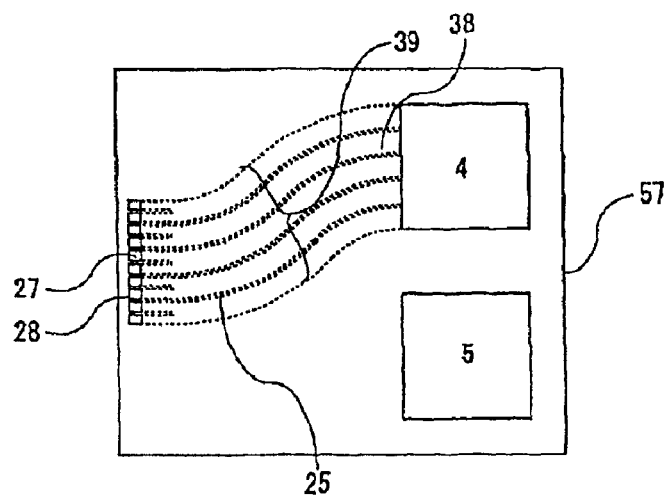
FIG. 18 is a plan view of a second plate member constituting the cooling device according to the fifth embodiment of the present invention.
Figure 19:
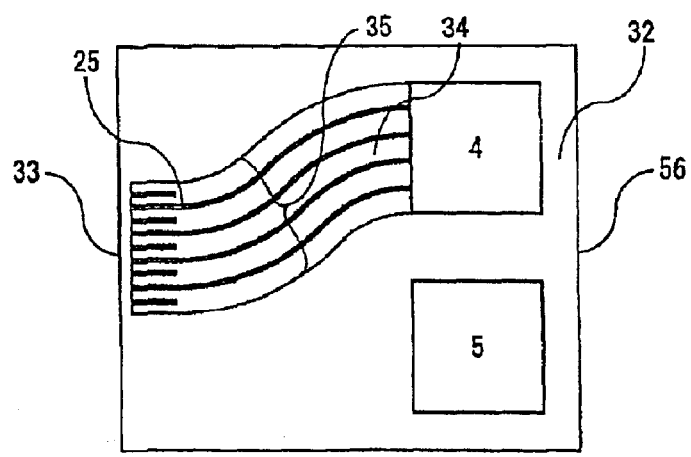
FIG. 19 is a plan view of a first plate member constituting the cooling device according to the fifth embodiment of the present invention.

FIGS. 17–19 show plate members constituting a cooling device according to a fifth embodiment of the present invention.

The cooling device of this embodiment comprises a first plate member 56 shown in FIG. 19, a second plate member 57 shown in FIG. 18 and a third plate member 58 shown in FIG. 17. The second plate member 57 is arranged on the first plate member 56 such that a reverse surface thereof is joined with an obverse surface 32 of the first plate member 56, and the third plate member 58 is arranged on the second plate member 57 such that a reverse surface thereof is joined with an obverse surface of the second plate member 57, so that the three plate members 56–58 are laminated to form the cooling device.

An inlet opening 4 and an outlet opening 5 of the same rectangular shape are formed in each of the plate members 56–58 at the respective same positions. A first grooved path 35 with one end communicating with the inlet opening 4 and the other end positioned in the vicinity of a peripheral side 33 is formed on the obverse surface of the first plate member 56.

A set of through holes 27 with bridge portions therebetween are formed in the second plate member 57 at a position corresponding to the position of the other end of the first grooved path 35 formed on the first plate member 56. A third grooved path 39 is formed on the reverse surface of the second plate member 57 which is arranged on the obverse surface of the thirst plate member 56.

A second grooved path 44 with one end communicating with the outlet opening 5 and the other end extending to a position corresponding to the set of through holes 27 of the second plate member 57 is formed on the reverse surface of the third plate member 58 which is arranged on the obverse surface of the second plate member 57. A depth of each groove of the first, second and third grooved paths 35, 45 and 39 is set greater than a half of thickness of the plate member.

Each of the first, second and third grooved paths 35, 45 and 39 has curved portions and also a constant width in an extending direction thereof so as to reduce a pressure loss of the coolant by sudden expansion or reduction of a sectional area of the flow passage. Each of the first, second and third grooved paths 35, 45 and 39 is divided by ridges 25 to form a plurality of grooves 34, 44 and 38. A width of each of the grooved paths 35, 45 and 39, which is a sum of widths of the grooves and the ridges, is constant along the extending direction thereof, and a width of each groove in each grooved path is constant along the extending direction thereof except of a region in the vicinity of the peripheral side 33.

The ridges 25 between the grooves 34 and 38 are joined with each other and the ridges 25 between the grooves 44 are joined with the obverse surface of the second plate member 57. The ridge 25 are formed in the vicinity of the set of through holes 27 for dividing each groove 34, 38 and 44 so as to increase an area of inner wall of the flow passage so that efficiency of heat-exchange between the object of cooling and the coolant is enhanced.

The bridging portions 28 between the through holes 27 are joined with the ridges 25 of the first grooved path 35 and the ridges 25 of the third grooved path 45 when the three plate members 56–58 are joined together.

The width of each of the grooved path 35, 39, 45, which is a sum of widths of the grooves 34, 38, 44 and the ridges 25, respectively, is set equal to a width of the object of cooling, i.e., a laser diode, lengths of sides of the rectangular inlet and the outlet openings 4 and 5, and a width of the set of through holes 27, so as to reduce the pressure loss of the coolant caused by sudden expansion or reduction of the sectional area of the flow passage of coolant.

Outlines of the curved portions of respective grooves of the first, second and third grooved path 35, 45, 39 are defined by concentric arcs, and each grooved path has two curved portions defined by two sets of concentric arcs. Each of the concentric arcs in one set is corresponding to and connected with an associated one of the concentric arcs in the other set with a common tangent line at a connection point.

Each of the first, second and third grooved paths 35, 45 and 39 has straight portions defined by straight lines and each of the straight lines is corresponding to and connected with an associated one of the concentric arcs of the curved portion so that a tangent line of the associated concentric arc is coincides with a direction of the straight line at a connection point. The above arrangement is adopted so as to reduce the pressure loss of the coolant caused by a discontinuity of the flow passage.

With the above arrangement of this embodiment, the pressure loss of the coolant caused by sudden expansion or reduction of the sectional area of the flow passage and discontinuity of the flow passage is reduced.

Sixth Embodiment

Figure 20:
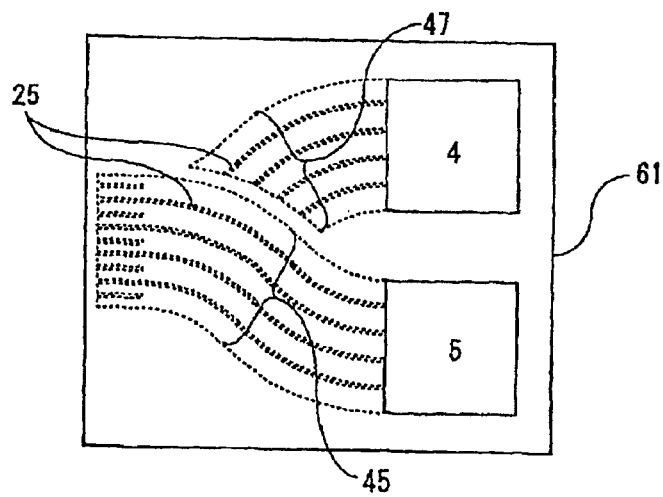
FIG. 20 is a plan view of a third plate member constituting a cooling device according to a sixth embodiment of the present invention.
Figure 21:
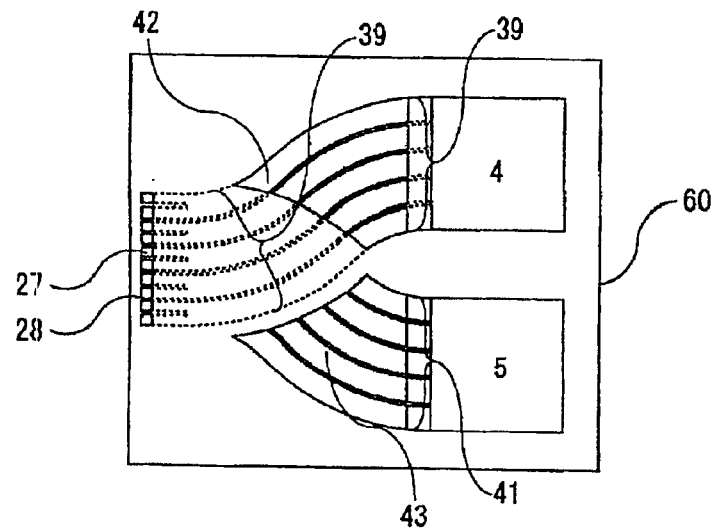
FIG. 21 is a plan view of a second plate member constituting the cooling device according to the sixth embodiment of the present invention.
Figure 22:
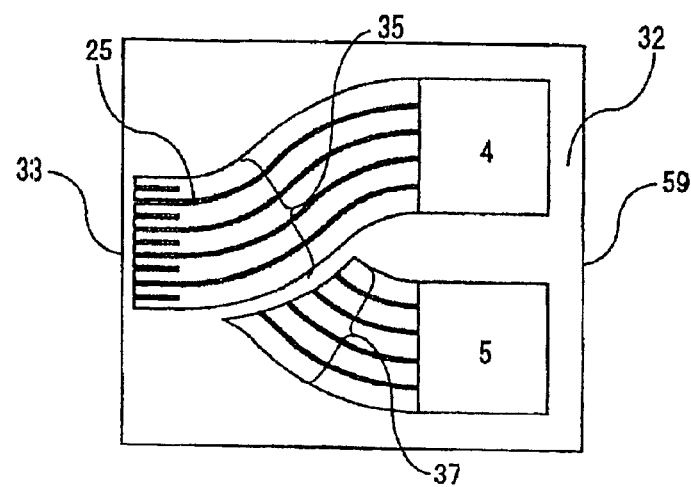
FIG. 22 is a plan view of a first plate member constituting the cooling device according to the sixth embodiment of the present invention.

FIGS. 20–22 show plate members constituting a cooling device according to sixth embodiment of the present invention. In this embodiment, grooved paths and opened paths having curved lines for reduction of sudden expansion or reduction of the sectional area of the flow passage and discontinuity of the flow passage are formed in addition to the grooved paths having curved lines in the fifth embodiment.

In particular, as the cooling device of the first embodiment, a first plate member 59 has a fifth grooved path 37 in addition to the first grooved path 35, and a second plate member 60 has a fourth grooved path 41, and first and second opened paths 42 and 43 in addition to the third grooved path 39, and the third plate member 61 has a sixth grooved path 47 on the reversed surface thereof in addition to the second grooved path 45.

A depth of each groove of the first to sixth grooved paths 35, 45, 39, 41, 37 and 47 is set greater than a half of the thickness of each plate member on which the grooved path is formed.

With the cooling device of this embodiment, the sectional area of the flow passage is increased to reduce the pressure loss in the same manner as in the first embodiment and also the pressure loss of the coolant caused by sudden expansion or reduction of the sectional area of the flow passage and discontinuity of the flow passage is reduced in the same manner as in the fifth embodiment, to realize a cooling device with further reduced pressure loss by a combination of arrangements of the first and fifth embodiments.

Seventh Embodiment

Figure 23:
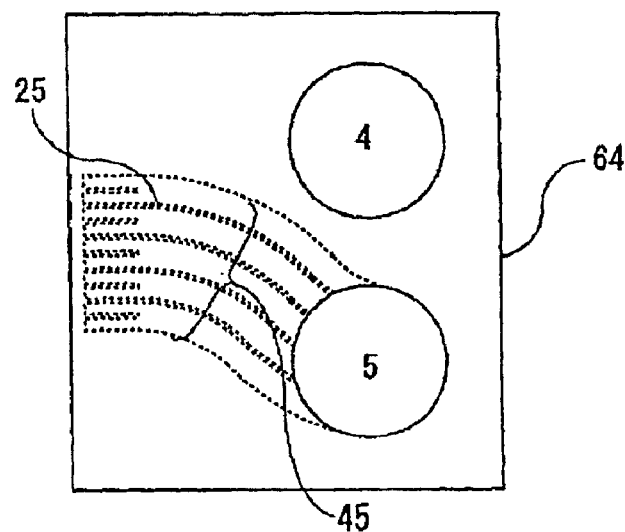
FIG. 23 is a plan view of a third plate member constituting a cooling device according to a seventh embodiment of the present invention.
Figure 24:
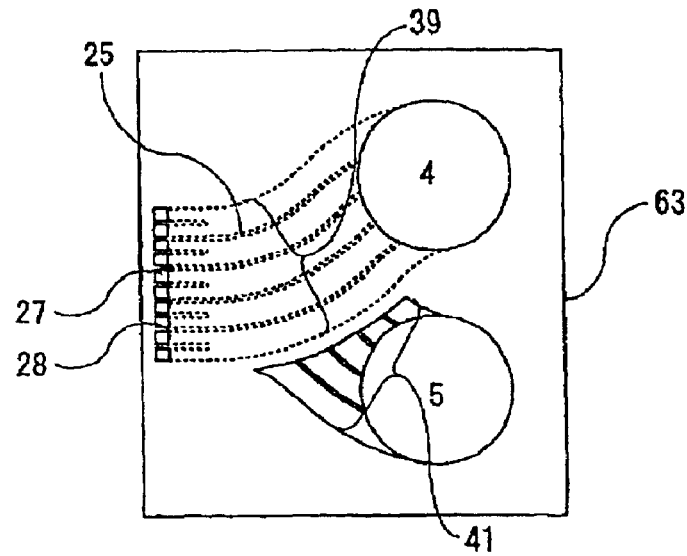
FIG. 24 is a plan view of a second plate member constituting the cooling device according to the seventh embodiment of the present invention.
Figure 25:
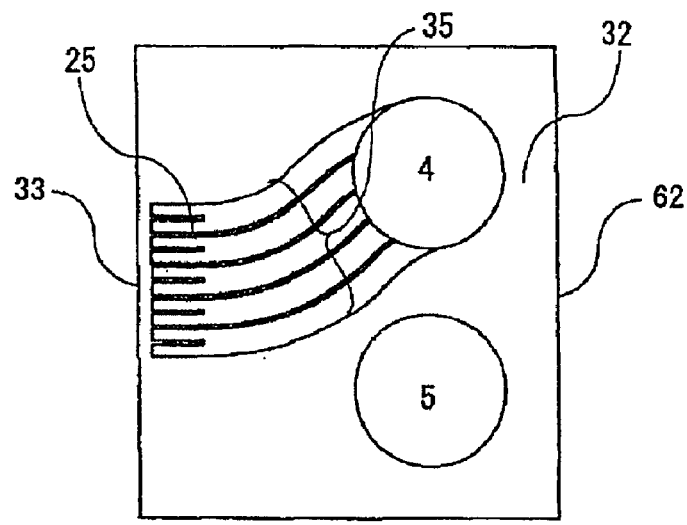
FIG. 25 is a plan view of a first plate member constituting the cooling device according to the seventh embodiment of the present invention.

FIGS. 23–25 show plate members constituting a cooling device according to a seventh embodiment of the present invention. The cooling device of this embodiment differs form that of the fifth embodiment in that an inlet opening 4 and an outlet opening 5 in each of the first to third plate member 62–64 has circular shapes and a fourth grooved path 41 is formed on an obverse surface of the second plate member 63.

With this arrangement, a degree of freedom of placement of the inlet opening 4 and the outlet opening 5 is increased in comparison with the square inlet and outlet openings in the fifth and sixth embodiments, so that size of the plate members 62–64 can be reduced. Therefore, the number of plate members formed from one metal sheet is increased to reduce the manufacturing cost of the cooling device. Further, the length of the flow passage is shortened to reduce the pressure loss of the coolant. Furthermore, generally used O-rings can be adopted for the circular inlet and outlet openings to securely prevent leakage of the coolant.

Eighth Embodiment

FIGS. 26–29 show plate members constituting a cooling device according to an eighth embodiment. The cooling device of this embodiment comprises a first plate member 29, two second plate members 30a, 30b, and a third plate member 31.

Figure 26:
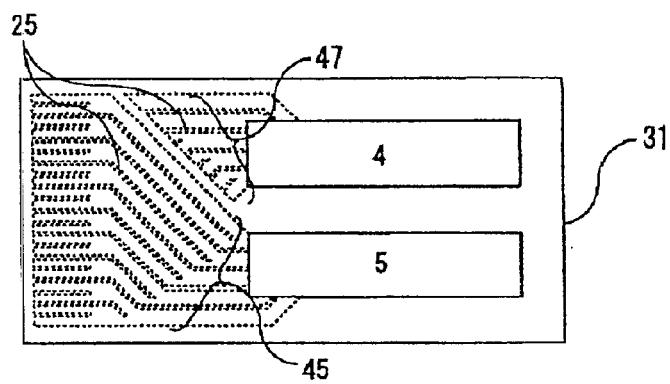
FIG. 26 is a plan view of a third plate member constituting a cooling device according to an eighth embodiment of the present invention.
Figure 27:
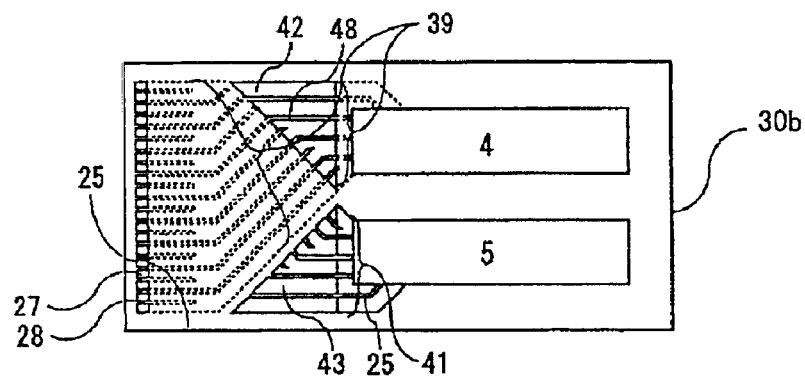
FIG. 27 is a plan view of a second plate member constituting the cooling device according to the eighth embodiment of the present invention.
Figure 28:
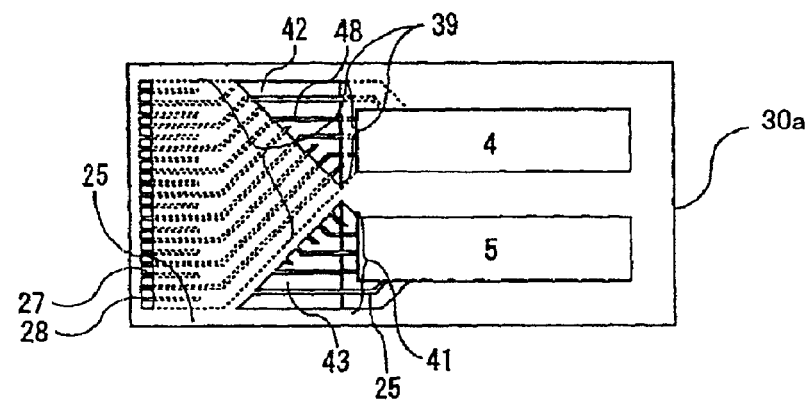
FIG. 28 is a plan view of an additional second plate member constituting the cooling device according to the eighth embodiment of the present invention.
Figure 29:
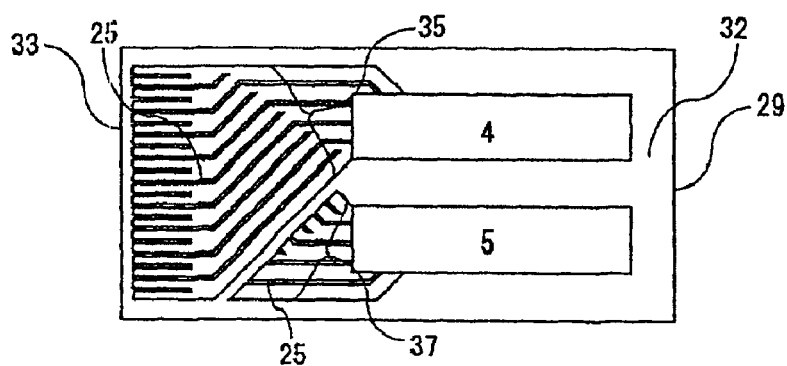
FIG. 29 is a plan view of a first plate member constituting the cooling device according to the eighth embodiment of the present invention.

The cooling device of this embodiment comprises a first plate member 29 shown in FIG. 29, two second plate members 30a and 30b shown in FIGS. 27 and 28, and a third plate member 31 shown in FIG. 26. The second plate member 30a is arranged on the first plate member 29 such that a reverse surface thereof is joined with an obverse surface 32 of the first plate member 29, the second plate member 30b is arranged on the second plate member 30a such that a reverse surface thereof is joined with an obverse surface of the second plate member 30a, and the third plate member 31 is arranged on the second plate member 30b such that a reverse surface thereof is joined with an obverse surface of the second plate member 30b, so that the four plate members 29, 30a, 30b and 31 are laminated to form the cooling device.

The first plate member 29 is identical to the first plate member 29 in the first embodiment as shown FIG. 7. The two second plate members 30a and 30b are identical to the second plate member 30 of the first embodiment as shown in FIG. 6. The third plate member 31 is identical to the third plate member 31 of the first embodiment as shown in FIG. 5.

Each of the two second plate member 30a and 30b has first and second opened paths 42 and 43 with partitions 48. The partitions 48 of the two second plate members 30a and 30b are joined together to prevent deformation of the cooling device possibly caused by existence of the opened paths 42 and 43 when the four plate members 29, 30a, 30b and 31 are joined together.

Further, the bridging portions 28 between the set of through holes 27 of the two second plate members 30a and 30b are joined together to enhance dispersion of heat from the object of cooling to the plate members to improve the cooling capability of the cooling device.

Although the thickness of the cooling device of this embodiment is made greater than those in the first to seventh embodiments because of the additional second plate member, a sectional area of the flow passage of the coolant is further increased by the grooved and opened paths of the additional second plate member, to further reduce the pressure loss of the coolant.

In this embodiment, a plurality of second plate members 30a and 30b identical to the second plate member 30 in the first embodiment are used to constitute the cooling device. Similarly, a plurality of second plate members identical to the second plate member 60 in the sixth embodiment may be used to constitute a cooling device with further reduced pressure loss of the coolant.

Ninth Embodiment

FIGS. 30–33 show plate members constituting a cooling device according to a ninth embodiment. The cooling device of this embodiment comprises a first plate member 50, two second plate members 51, 65, and a third plate member 52.

Figure 30:
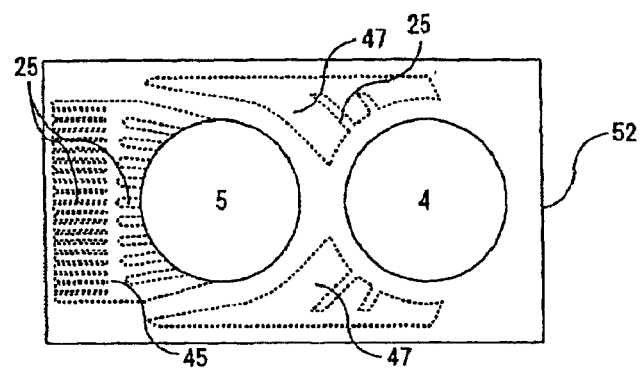
FIG. 30 is a plan view of a third plate member constituting a cooling device according to an ninth embodiment of the present invention.
Figure 31:
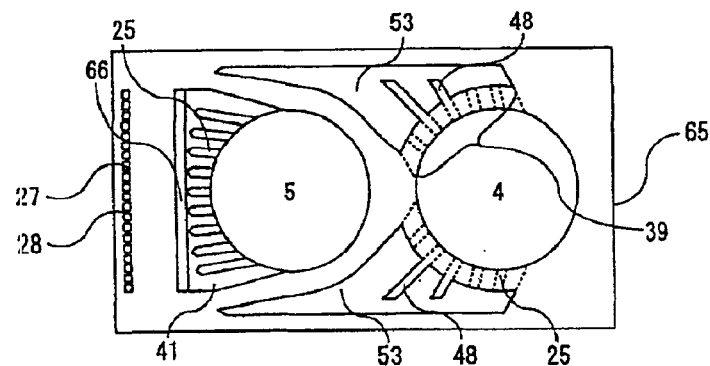
FIG. 31 is a plan view of a second plate member constituting the cooling device according to the ninth embodiment of the present invention.
Figure 32:
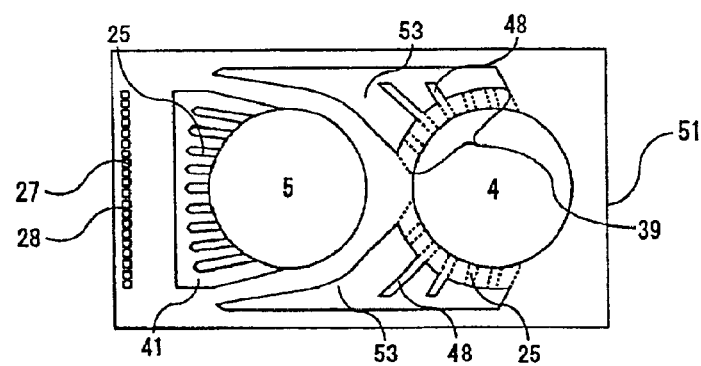
FIG. 32 is a plan view of an additional second plate member constituting the cooling device according to the ninth embodiment of the present invention.
Figure 33:
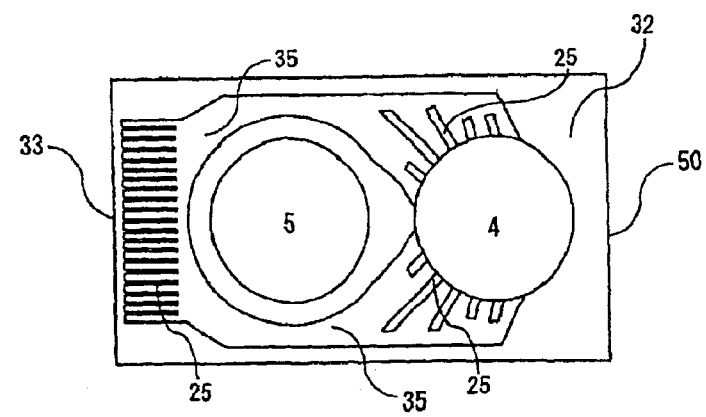
FIG. 33 is a plan view of a first plate member constituting the cooling device according to the ninth embodiment of the present invention.

The cooling device of this embodiment comprises a first plate member 50 shown in FIG. 33, two second plate members 51 and 65 shown in FIGS. 32 and 31, and a third plate member 52 shown in FIG. 30. The second plate member 51 is arranged on the first plate member 50 such that a reverse surface thereof is joined with an obverse surface 32 of the first plate member 50, the second plate member 65 is arranged on the second plate member 51 such that a reverse surface thereof is joined with an obverse surface of the second plate member 51, and the third plate member 52 is arranged on the second plate member 65 such that a reverse surface thereof is joined with an obverse surface of the second plate member 65, so that the four plate members 50, 51, 65 and 52 are laminated to form the cooling device.

The first plate member 50 is identical to the first plate member 50 in the third embodiment as shown in FIG. 13, and the second plate member 51 is identical to the second plate member in the third embodiment shown in FIG. 12. The additional second plate member 65 has similar structure as that of the second plate member 51 in the third embodiment but differs from that in that the second plate member 65 has an additional opened path 66. The third plate member 52 is identical to the third plate member 52 in the third embodiment as shown in FIG. 11.

A plurality of second plate members 51 and 65 having identical or similar structure as the second plate member in the third embodiment are used to constitute the cooling device of this embodiment, to further reduce pressure loss of the coolant.

Tenth Embodiment

Figure 34:
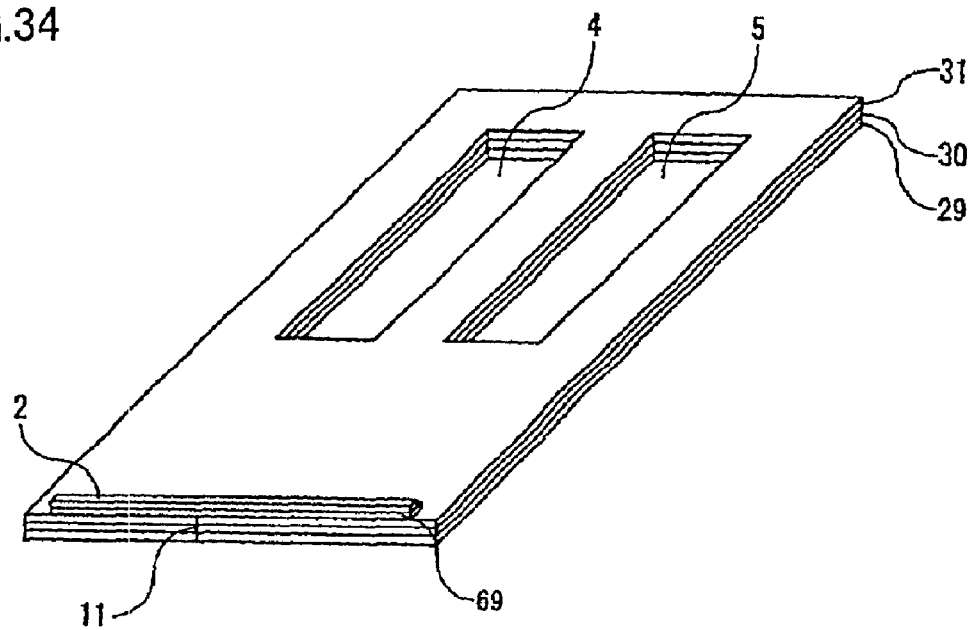
FIG. 34 is a perspective view of a cooling device according to a tenth embodiment of the present invention.
Figure 35:
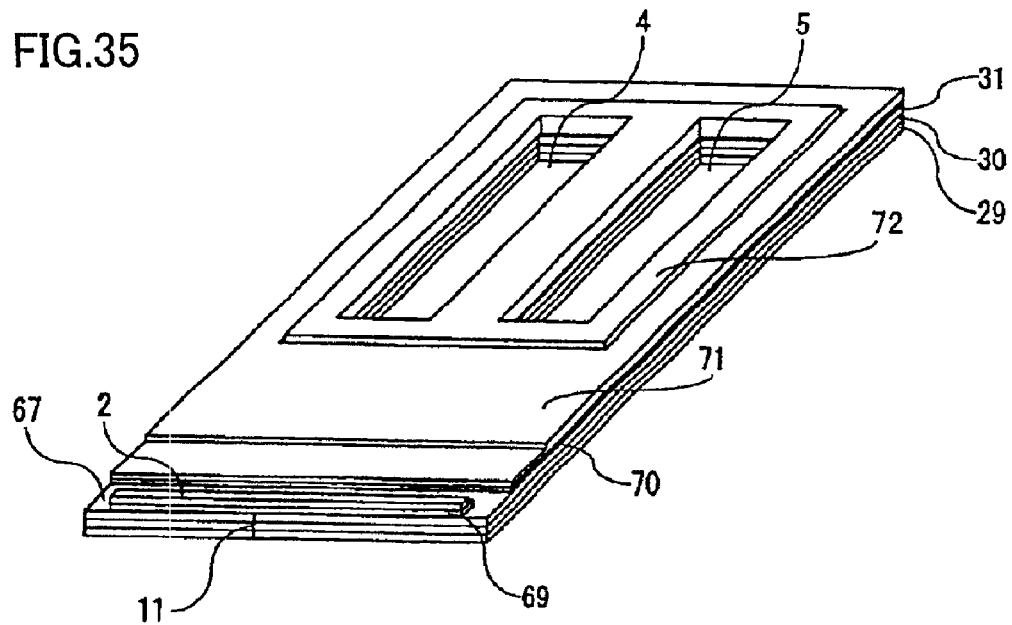
FIG. 35 is a perspective view of a cooling device with a metal plate and an isolating plate thereon.

A cooling device for constituting a light source device as a tenth embodiment of the present invention will be described referring to FIGS. 34 and 35. As shown in FIGS. 34 and 35, a cooling device 67 has a laminated body constituted by the plate members 29–31 according to the first embodiment. A laser diode (LD) bar 2 having an epitaxial layer and a semiconductor substrate layer is fixed on the third plate member 31, which is the uppermost layer of the cooling device 67, along a front face 11 of the cooling device 67 such that an electrode formed on the epitaxial layer is directed downwardly by soldering with alloy of lead and tin (Pb—Sn).

In the case where the plate members 29–31 are joined together by soldering, the laser diode bar 2 may be directly soldered on the upper surface of the third plate member 31 with solder coating. In this embodiment, however, the laser diode bar 2 is electrically and thermally connected with the cooling device 67 through a sub-mount 69 arranged between the laser diode bar 2 and the cooling device 67. The sub-mount is made of metal having high heat conductivity such as oxygen free copper and has solder layers on both sides.

With this arrangement, an soldering operation of the laser diode bar 2 on the cooling device 67 is made easy to reduce the manufacturing cost and stress on the laser diode bar 2 caused by a difference of thermal expansion of the laser diode bar 2 and the cooling device 67.

A metal plate 71 is fixed on the obverse surface of the third plate member 31 through an isolating plate 70. One electrode formed on the semiconductor layer of the laser diode bar 2 is electrically connected with the metal plate 71 through a metal film or a lead line which is not depicted in FIG. 35.

The metal plate 71 is arranged to extend to the vicinity of the laser diode bar 2 so that the other electrode formed on the semiconductor layer of the laser diode bar 2 is directly connected with the metal plate 71, to reduce the number of parts. Each of the metal plate 71 and the isolating plate 70 has an opening greater than the inlet opening 4 and the outlet opening 5 of the cooling device 67, and a sealing member 72 for preventing leakage of the coolant is arranged at the opening.

With the above arrangement, the laser diode bar 2 is supplied with electric current by supplying electric current between the reverse surface of the cooling device 67, i.e., the reverse surface of the first plate member 29 and the metal plate 71. At the same time, the coolant is supplied form the inlet opening 4 and discharged from the outlet opening 5 through the flow passage formed in the cooling device 67 to cool the laser diode bar 2. Thus, the light source device 68 for generating the desired laser beam is obtained.

A plurality of light source devices 68 are stacked so that respective laser diode bars 2 electrically connected in series to form a laser diode array and respective inlet openings 4 and outlet openings 5 are aligned in series to form common inlet opening and outlet openings for supplying and discharging respective cooling device 67 with the coolant, to realize a surface illuminating light source.

The cooling device 67 of the present invention has sufficient mechanical strength with thin thickness and a low pressure loss in the device. Further, when a larger number of cooling devices are stacked to form the surface illuminating device, a pressure loss in the coolant supplying path formed by the inlet openings 4 connected with one another and the coolant discharging path formed by the outlet openings 5 connected with one another is low since areas of the inlet opening 4 and the outlet opening 5 are large. In addition to the above features, sufficient flow rate of coolant necessary for cooling the laser diode bars is realized, to perform an excellent cooling effect with low cost. Thus, the surface illuminating device having a large illuminating area with high reliability and high density of output light is realized with low cost.

A surface illuminating device can be constituted by the cooling device comprising the plate members 29–31 of the first embodiment, and also the cooling device comprising the plate members 29, 49 and 31 according to the second embodiment, the cooling device comprising the plate members 50–52 according to the third embodiment, the cooling device comprising the plate members 50, 54 and 55 according to the fourth embodiment, the cooling device comprising the plate members 56–58 according to the fifth embodiment, the cooling device comprising the plate members 59–61 according to the sixth embodiment, the cooling device comprising the plate members 62–64 according to the seventh embodiment, the cooling device comprising the four plate members 29–31 according to the eighth embodiment, and the cooling device comprising the four plate members 50–52 and 65 according to the ninth embodiment.

What is claimed is:

1. A cooling device for cooling an object of cooling thermally connected therewith by flowing coolant through a flow passage formed therein, comprising:
    a first plate member having an inlet opening for introducing the coolant, and a first grooved path formed on one surface thereof extending from one end communicating with said inlet opening to the other end positioned in the vicinity of one peripheral side thereof;
    a second plate member with one surface arranged on said one surface of said first plate member, having a set of through holes formed at a position corresponding to said other end of the first grooved path of said first plate member; and
    a third plate member with one surface arranged on the other surface of said second plate member, having an outlet opening for discharging the coolant and a second grooved path formed on said one surface thereof and extending from one end communicating with said outlet opening to the other end positioned to be corresponding to said set of through holes formed in said second plate member;
    said second plate member further having a third grooved path formed on said one surface thereof, a fourth groove path formed on said other surface thereof and at least one opened path opened from said one surface to said other surface thereof,
    wherein said first, second and third plate members are joined together to be laminated, so that said first, second, third and fourth grooved paths, said set of through holes and said at least one opened path jointly forming the flow passage of the coolant.

2. A cooling device according to claim 1, wherein said second plate member further has an inlet opening and an outlet opening positioned to be corresponding to said inlet opening and said outlet opening formed in said first plate member and said third plate member, respectively, and said at least one opened path communicates with one of said inlet opening and said outlet opening formed in said second plate member through one of said third grooved path or said fourth grooved path.

3. A cooling device according to claim 2, wherein one of said inlet opening and said outlet opening which does not communicate with said at least one opened path through one of said third grooved path or said fourth grooved path communicates with one of said third grooved path and said fourth grooved path which does not directly communicate with said at least one opened path.

4. A cooling device according to claim 2, wherein said second plate member has at least two opened paths and one of the opened paths communicates with one of said inlet opening and said outlet opening formed in said second plate member through said third grooved path, and another of the opened paths communicates with one of the inlet opening and the outlet opening, which does not communicates with said one of the opened path through said third grooved path, through said fourth grooved path.

5. A cooling device according to claim 1, wherein said first plate member further has a fifth grooved path which does not directly communicate with said first grooved path on said one surface thereof.

6. A cooling device according to claim 5, wherein said second grooved path on said one surface of said third plate member and said fifth grooved path on said one surface of said first plate member communicate with each other through said at least one opened path formed in said second plate member.

7. A cooling device according to claim 1, wherein said third plate member further has a sixth grooved path which does not directly communicate with said second grooved path on said one surface thereof.

8. A cooling device according to claim 7, wherein said first grooved path on said one surface of said first plate member and said sixth grooved path formed on said one surface of said third plate member communicate with each other through said at least one opened path in said second plate member.

9. A cooling device according to claim 1, wherein said at least one opened path in said second plate member has partitions having thickness substantially equal to thickness of said second plate member for dividing the opened path.

10. A cooling device according to claim 9, wherein one end of each of said partitions is connected with a bottom portion or a ridge of said third grooved path or said fourth grooved path, to be held integrally with said second plate member.

11. A cooling device according to claim 9, wherein at least a part of said partitions of said at least one opened path is positioned to be joined with at least a part of ridges formed in said first, second, fifth and sixth grooved paths.

12. A cooling device according to claim 1, wherein a plurality of second plate members are arranged between said first plate member and said third plate member.

13. A cooling device according to claim 12, wherein at least two of said plurality of second plate members are substantially identical to each other.

14. A cooling device according to claim 12, wherein each of said plurality of second plate members has at least one opened path with partitions, and the partitions of adjacent second plate members are arranged at the substantially the same position in respective second plate members to be joined together.

15. A cooling device according to claim 12, wherein each of said plurality of second plate members has a set of through holes with bridge portions therebetween, and the bridge portions of adjacent second plate members are arranged at the same position in respective second plate members to be joined together.

16. A cooling device according to claim 1, wherein a depth of at least one of said first, second, third, fourth, fifth and sixth grooved paths is greater than a half of thickness of the plate member on which the grooved path is formed.

17. A cooling device according to claim 16, wherein said third grooved path and said fourth grooved path have depth greater than a half of thickness of said second plate member and do not communicate with each other.

18. A cooling device according to claim 1, wherein at least one of said first, second, third, fourth, fifth and sixth grooved paths has a portion formed by a plurality of grooves divided by ridges which are joined with the plate member confronting the ridges.

19. A cooling device according to claim 1, wherein said set of through holes comprises a series of minute holes with bridging portions therebetween, said bridging portions being positioned to correspond to positions of ridges formed at one of said other end of said first grooved path or said other end of said second grooved path to be joined together.

20. A cooling device according to claim 1, wherein at least one pair of the ridges formed in said first, second, third, fourth, fifth and sixth grooved paths on confronting surfaces of said first, second and third plate member have portions positioned to confront one another to be joined together.

21. A cooling device for cooling an object of cooling thermally connected therewith by flowing coolant through a flow passage formed therein, comprising:
   a first plate member having an inlet opening for introducing the coolant, and a first grooved path formed on one surface thereof extending from one end communicating with said inlet opening to the other end positioned in the vicinity of one peripheral side thereof;
   a second plate member with one surface arranged on said one surface of said first plate member, having a set of through holes formed at a position corresponding to said other end of the first grooved path of said first plate member; and
   a third plate member with one surface arranged on the other surface of said second plate member, having an outlet opening for discharging the coolant and a second grooved path formed on said one surface thereof and extending from one end communicating with said outlet opening to the other end positioned to be corresponding to said set of through holes formed in said second plate member,
   at least one of said first grooved path and said second grooved path having a curved portion and a substantially constant width along an extending direction thereof,
   wherein said first, second and third plate members are joined together to be laminated, so that said first and second grooved paths, and said set of through holes jointly forming the flow passage of the coolant.

22. A cooling device according to claim 21, wherein said second plate member further has a third grooved path formed on said one surface thereof.

23. A cooling device according to claim 22, wherein at least a part of said third grooved path is arranged to confront at least a part of said first grooved path.

24. A cooling device according to claim 22, wherein said second plate member has an inlet opening for introducing the coolant, and said third grooved path communicates with said inlet opening in said second plate member.

25. A cooling device according to claim 21, wherein said second plate member further has a fourth grooved path formed on said other surface thereof.

26. A cooling device according to claim 25, wherein at least a part of said fourth grooved path is arranged to confront at least a part of said second grooved path.

27. A cooling device according to claim 25, wherein said second plate member has an outlet opening for discharging the coolant, and said fourth grooved path communicates with said outlet opening in said second plate member.

28. A cooling device according to claim 21, wherein a depth of at least one of said first and second grooved paths is greater than a half of thickness of the plate member on which the grooved path is formed.

29. A cooling device according to claim 28, wherein said second plate member further has a third grooved path on said one surface thereof and a fourth grooved path said other surface thereof, and said third grooved path and said fourth grooved path have depth greater than a half of thickness of said second plate member and do not directly communicate with each other.

30. A cooling device according to claim 21, wherein at least one of said first and second grooved paths has a portion formed by a plurality of grooves divided by ridges which are joined with the plate member confronting the ridges.

31. A cooling device according to claim 21, wherein said second plate member further has a third grooved path on said one surface thereof and a fourth grooved path said other surface thereof, and at least one of said first, second, third and fourth grooved paths has a portion formed by a plurality of grooves divided by ridges which are joined with the plate member confronting the ridges, each groove having a constant width along an extending direction thereof.

32. A cooling device according to claim 31, wherein a width of each of said first to fourth grooved paths is obtained by adding a sum of widths of the grooves and a sum of the ridges between the grooves.

33. A cooling device according to claim 21, wherein a width of at least one of said first and second grooved paths is substantially equal to a width of a heating portion of the object of cooling.

34. A cooling device according to claim 21, wherein each of said inlet opening and said outlet opening has a form of a rectangle with one side having a length substantially equal to a width of the grooved path communicating therewith.

35. A cooling device according to claim 21, wherein each of said inlet opening and said outlet opening has a form of a circle having a diameter substantially equal to a width of the grooved path communicating therewith.

36. A cooling device according to claim 21, widths of said first grooved path and said second grooved path are substantially equal to a width of said set of through holes formed in said second plate member.

37. A cooling device according to claim 21, wherein at least one of said first and second grooved paths has a curved portion defined by concentric arcs.

38. A cooling device according to claim 37, wherein at least one of said first and second grooved paths has a plurality of curved portions defined by sets of concentric arcs, each of the concentric arcs in one set being connected with an associated one of the concentric arcs in an adjacent set and having a common tangent at a connection point thereof.

39. A cooling device according to claim 36, wherein grooves of at least one of said first to fourth grooved paths has a straight portion defined by straight lines, each of the straight lines being connected with an associated one of the concentric arcs of said curved portion and directed to a tangent of said associated one of the concentric arcs at a connecting point thereof.

40. A cooling device according to claim 21, wherein said set of through holes comprises a series of minute holes with bridging portions therebetween, said bridging portions being positioned to correspond to positions of ridges formed at one of said other end of said first grooved path or said other end of said second grooved path to be joined together.

41. A cooling device according to claim 21, wherein said second plate member further has a third grooved path formed on said one surface thereof and a fourth grooved path formed on said other surface thereof, and at least one pair of the ridges formed in said first, second, third and fourth grooved paths on confronting surfaces of said first, second and third plate members have portions positioned to confront one another to be joined together.

42. A cooling device for cooling an object of cooling thermally connected therewith by flowing coolant through a flow passage formed therein, comprising:
   a first plate member having an inlet opening for introducing the coolant, and a first grooved path formed on one surface thereof extending from one end communicating with said inlet opening to the other end positioned in the vicinity of one peripheral side thereof;
   a second plate member with one surface arranged on said one surface of said first plate member, having a set of through holes formed at a position corresponding to said other end of the first grooved path of said first plate member; and
   a third plate member with one surface arranged on the other surface of said second plate member, having an outlet opening for discharging the coolant and a second grooved path formed on said one surface thereof and extending from one end communicating with said outlet opening to the other end positioned to be corresponding to said set of through holes formed in said second plate member;
   said second plate member further having a third grooved path formed on said one surface thereof, a fourth groove path formed on said other surface thereof, and said third grooved path and said fourth grooved path having depth greater than a half of thickness of said second plate member and not directly communicating with each other,
   wherein said first, second and third plate members are joined together to be laminated, so that said first, second, third and fourth grooved paths and said set of through holes jointly forming the flow passage of the coolant.

43. A cooling device according to claim 42, wherein at least a part of said third grooved path is arranged to confront at least a part of said first grooved path.

44. A cooling device according to claim 42, wherein at least a part of said fourth grooved path is arranged to confront at least a part of said second grooved path.

45. A cooling device according to claim 42, wherein said second plate member has an inlet opening for introducing the coolant, and said third grooved path communicates with said inlet opening in said second plate member.

46. A cooling device according to claim 42, wherein said second plate member has an outlet opening for discharging the coolant, and said fourth grooved path communicates with said outlet opening in said second plate member.

47. A cooling device according to claim 42, wherein at least one of said first, second, third and fourth grooved paths has a portion formed by a plurality of grooves divided by ridges which are joined with the plate member confronting the ridges.

48. A cooling device according to claim 42, wherein said set of through holes comprises a series of minute holes with bridging portions therebetween, said bridging portions being positioned to correspond to positions of ridges formed at one of said other end of said first grooved path or said other end of said second grooved path to be joined together.

49. A cooling device according to claim 42, wherein at least one pair of the ridges formed in said first, second, third and fourth grooved paths on confronting surfaces of said first, second and third plate member have portions positioned to confront one another to be joined together.

50. A cooling device according to any one of claims 1, 21 and 42, wherein all of the grooved paths formed on said first, second and third plate members have depth greater than a half of thickness of the plate member on which grooved path is formed.

51. A cooling device according to any one of claims 1, 21 and 42, wherein all of said first, second and third plate members have substantially the same thickness.

52. A cooling device according to any one of claims 1, 21 and 42, wherein all of said first, second and third plate members are made of the same material.

53. A cooling device according to any one of claims 1, 21 and 42, wherein all of said first, second and third plate members are made of metal.

54. A cooling device according to any one of claims 1, 21 and 42, wherein an inlet opening and an outlet opening are formed in all of said first, second and third plate members at the same positions.

55. A cooling device according to any one of claims 1, 21 and 42, wherein outer peripheries of said first, second and third plate members, said grooved paths, said at least one opened paths, said inlet opening, said outlet opening and said set of through holes are formed by chemical etching using photo-resist patterns.

56. A cooling device according to any one of claims 1, 21 and 42, a width of the grooved paths or a width of each groove of the grooved paths formed on said first, second and third plate member is not less than twice a depth of the grooved path or each groove and not greater than three times the depth of the grooved path or each groove.

57. A cooling device according to any one of claims 1, 21 and 42, wherein a width of said at least one opened path or a distance of adjacent partitions formed in said at least one opened path is not less than the thickness of said second plate member and not greater than five times the thickness of said second plate member.

58. A cooling device according to any one of claims 1, 21 and 42, wherein thickness of said first, second and third plate members is not less than 200 $\mu$m and not greater than 500 $\mu$m.

59. A cooling device according to any one of claims 1, 21 and 42, wherein at least one of said grooved paths on said first, second and third plate members and said at least one opened path and said set of through holes in said second plate member forms micro channels with the smallest sectional area thereof greater than 100 $\mu$m.

60. A cooling device according to any one of claims 1, 21 and 42, wherein all of said grooved paths on said first, second and third plate members and said at least one opened path and said set of through holes in said second plate member forms micro channels with the smallest sectional area thereof greater than 100 $\mu$m.

61. A cooling device according to any one of claims 1, 21 and 42, wherein a width of a portion of the grooved path communicating with said inlet opening or said outlet opening is not less than 300 μm and not greater than 1000 μm in the vicinity of said inlet opening or said outlet opening.

62. A cooling device according to any one of claims 1, 21 and 42, wherein a sum of an area of said inlet opening and an area of said outlet opening is not less than 20% of an area of a rectangle of the plate member.

63. A cooling device according to any one of claims 1, 21 and 42, wherein said first, second and third plate members are joined together by diffusion welding, or soldering with solder material containing Ag, Pb or Sn.

64. A cooling device according to claim 63, wherein said first, second and third plate members are previously coated with solder material containing Pb or Sn by electroless plating before joining together.

65. A cooling device according to any one of claims 1, 21 and 42, wherein said first plate member further has a laser diode bar on the other surface thereof along said peripheral side or said third plate member further has a laser diode bar on the other surface thereof along said peripheral side, to constitute a light source device.

66. A cooling device according to claim 65, wherein said laser diode is electrically and thermally connected to said first plate member or said third plate member through a metal sub-mount having solder layers on both sides thereof.

67. A cooling device according to claim 65, wherein a plurality of sets of said first plate member, second plate member and third plate members respectively jointed together with the laser diode bars to constitute the light source devices are stacked with sealing members between them around said inlet opening and said outlet opening in a state where a metal plate or layer electrically connected to an electrode of said laser diode bar which is not connected to said first plate member or said third plate member is fixed on the other surface of said first plate member or the other surface of said third plate member through an isolating member except regions near the laser diode bar and said inlet opening and said outlet opening, to constitute surface illuminating device.

* * * * *

UNITED STATES PATENT AND TRADEMARK OFFICE
CERTIFICATE OF CORRECTION

PATENT NO. : 6,865,200 B2
APPLICATION NO. : 10/178454
DATED : March 8, 2005
INVENTOR(S) : Hiroshi Takigawa et al.

It is certified that error appears in the above-identified patent and that said Letters Patent is hereby corrected as shown below:

Column 25, line 61, change "forming" to -- form --

Column 26, line 17, change "communicates" to --communicate --

Column 27, line 57, change "forming" to --form --

Column 28, line 17, after "path" insert -- on --

Column 28, line 28, after "path" insert -- on --

Column 28, line 50, after "clam 21," insert -- wherein --

Column 29, line 42, change "groove" to --grooved--

Column 29, line 50, change "forming" to -- form --

Column 30, line 17, after "grooved" insert -- the --

Column 30, line 35, change "paths" to -- path--

Column 30, line 39, after "42," insert -- wherein --

Column 30, line 41, change "member" to -- members--

Column 30, line 58, change "forms" to -- form --

Column 30, line 64, change "forms" to -- form --

Column 32, line 6, after "member," insert -- said --

Column 32, line 7, after "and" insert -- said --

Column 32, line 7, change "members" to -- member --

Column 32, line 7, change "jointed" to -- joined --

UNITED STATES PATENT AND TRADEMARK OFFICE
CERTIFICATE OF CORRECTION

PATENT NO. : 6,865,200 B2
APPLICATION NO. : 10/178454
DATED : March 8, 2005
INVENTOR(S) : Hiroshi Takigawa et al.

It is certified that error appears in the above-identified patent and that said Letters Patent is hereby corrected as shown below:

Column 32, line 18, after "constitute" insert -- a--

Signed and Sealed this

Second Day of January, 2007

JON W. DUDAS
*Director of the United States Patent and Trademark Office*